US012769990B2

(12) United States Patent
Hsu et al.

(10) Patent No.: US 12,769,990 B2
(45) Date of Patent: Oct. 20, 2026

(54) METHODS AND APPARATUS FOR IMPLEMENTING NEURAL NETWORKS USING 3D NON-VOLATILE MEMORY ARRAYS

(71) Applicants: Fu-Chang Hsu, San Jose, CA (US); Kevin Hsu, San Jose, CA (US)

(72) Inventors: Fu-Chang Hsu, San Jose, CA (US); Kevin Hsu, San Jose, CA (US)

( * ) Notice: Subject to any disclaimer, the term of this patent is extended or adjusted under 35 U.S.C. 154(b) by 1092 days.

(21) Appl. No.: 17/535,510

(22) Filed: Nov. 24, 2021

(65) Prior Publication Data

US 2022/0164638 A1 May 26, 2022

Related U.S. Application Data

(60) Provisional application No. 63/118,600, filed on Nov. 25, 2020.

(51) Int. Cl.
*G11C 11/54* (2006.01)
*G06N 3/045* (2023.01)
(Continued)

(52) U.S. Cl.
CPC ............. *G06N 3/063* (2013.01); *G06N 3/045* (2023.01); *G11C 11/54* (2013.01); *G11C 16/0483* (2013.01)

(58) Field of Classification Search
CPC ............................ G11C 11/54; G11C 16/0483
See application file for complete search history.

(56) References Cited

U.S. PATENT DOCUMENTS 5,256,911 A * 10/1993 Holler .................... G06N 3/063 706/37
2018/0101359 A1 4/2018 Harada et al.
(Continued)

FOREIGN PATENT DOCUMENTS

CN 109686754 A 4/2019
CN 110574043 A 12/2019

OTHER PUBLICATIONS

International Search Report, dated Feb. 15, 2022, for corresponding International Application No. PCT/US2021/060862 (2 pages).
(Continued)

*Primary Examiner* — Mushfique Siddique
(74) *Attorney, Agent, or Firm* — INTELLECTUAL PROPERTY LAW GROUP LLP

(57) ABSTRACT

Methods and apparatus for neural network arrays are disclosed. In an embodiment, a neural network array includes a plurality of strings, each string having a drain select gate transistor connected to a plurality of non-volatile memory cells that are connected in series and function as synapses, and a plurality of output nodes, each output node connected to receive output signals from a plurality of drain terminals of the drain select gates. The array also includes a plurality of input nodes, each input node connected to provide input signals to a plurality of gate terminals of the drain select gates, and a plurality of weight select signals connected to the plurality of non-volatile memory cells in each string, respectively. Each weight select signal provides a selected voltage to a selected non-volatile memory cell to cause the selected non-volatile memory cell to conduct current according to a selected characteristic of the selected non-volatile memory cell.

19 Claims, 36 Drawing Sheets

(51) Int. Cl.
*G06N 3/063* (2023.01)
*G11C 16/04* (2006.01)

(56) References Cited

U.S. PATENT DOCUMENTS

| | | | | |
|---|---|---|---|---|
| 2018/0165573 | A1* | 6/2018 | Hsu | G06N 3/063 |
| 2019/0108433 | A1* | 4/2019 | Hsu | G06N 3/048 |
| 2019/0164046 | A1 | 5/2019 | Song et al. | |
| 2019/0213234 | A1* | 7/2019 | Bayat | G06N 3/04 |
| 2020/0051636 | A1 | 2/2020 | Tran et al. | |
| 2020/0174864 | A1* | 6/2020 | Bhardwaj | G06F 11/073 |
| 2020/0194049 | A1 | 6/2020 | Nikonov et al. | |
| 2020/0211648 | A1* | 7/2020 | Minucci | G06N 3/048 |
| 2020/0298005 | A1 | 9/2020 | Howard | |
| 2020/0311523 | A1* | 10/2020 | Hoang | G06F 7/496 |
| 2022/0137926 | A1* | 5/2022 | Yoshida | G06N 3/065<br>708/603 |
| 2022/0164638 | A1* | 5/2022 | Hsu | G06N 3/0442 |

OTHER PUBLICATIONS

Written Opinion of the International Searching Authority, mailing date of Feb. 15, 2022, for corresponding International Application No. PCT/US2021/060862 (5 pages).
China Office Action, dated Sep. 27, 2025 for corresponding China Application No. 2021800910109 with English summary (19 pages).

* cited by examiner

METHODS AND APPARATUS FOR IMPLEMENTING NEURAL NETWORKS USING 3D NON-VOLATILE MEMORY ARRAYS

CROSS-REFERENCE TO RELATED APPLICATIONS

This application claims the benefit of priority under 35 U.S.C. § 119 of U.S. Provisional Patent Application No. 63/118,600, filed on Nov. 25, 2020 and entitled "NEURAL NETWORK ARRAY," which is hereby incorporated herein by reference in its entirety.

FIELD OF THE INVENTION

The exemplary embodiments of the present invention relate generally to the field of semiconductors and integrated circuits, and more specifically to the design and operation of neural network arrays.

BACKGROUND OF THE INVENTION

Artificial neural networks are a key component of artificial intelligence (AI). An artificial neural network typically comprises multiple layers of neurons. Each layer comprises the input neurons and output neurons. The input neurons and output neurons are connected though synapses. Each input neuron in is connected to all the output neurons. Each synapse provides a 'weight' value to multiply the input from the input neuron and then sends the result signal to the output neuron. By adjusting the weight values of the synapses, the neural network can be trained to perform many tasks such as pattern recognition, voice recognition, and so on. A deep-learning neural network may contain more than ten layers and each layer contains thousands of neurons.

The typical artificial neural network is implemented by using CPU (central processing unit) or GPU (graphics processing unit) to simulate the function of neurons and synapses. This requires a huge amount of computing for big-data applications, which leads to very long training time and also very high power consumption.

SUMMARY

In various exemplary embodiments, methods and apparatus are provided for implementing neural networks using non-volatile memory arrays and resistive type of non-volatile memory arrays, such as RRAM (resistive random-access memory) and PCM (phase change memory). The neural network can be configured as a 2D (two dimensional) or 3D (three dimensional) structures. Non-volatile memory devices are a resistive type of memory and are non-volatile, high-density, low-power, and low-cost. Therefore, these devices are good candidates to implement large-scale neural networks for deep machine learning in artificial intelligence (AI) applications.

In an embodiment, a neural network array includes a plurality of strings, each string having a drain select gate transistor connected to a plurality of non-volatile memory cells that are connected in series and function as synapses, and a plurality of output nodes, each output node connected to receive output signals from a plurality of drain terminals of the drain select gates. The array also includes a plurality of input nodes, each input node connected to provide input signals to a plurality of gate terminals of the drain select gates, and a plurality of weight select signals connected to the plurality of non-volatile memory cells in each string, respectively. Each weight select signal provides a selected voltage to a selected non-volatile memory cell to cause the selected non-volatile memory cell to conduct current according to a selected characteristic of the selected non-volatile memory cell.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

In various exemplary embodiments, methods and apparatus for implementing neural networks using non-volatile memory arrays are provided. Those of ordinary skilled in the art will realize that the following detailed description is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

Figure 1A:
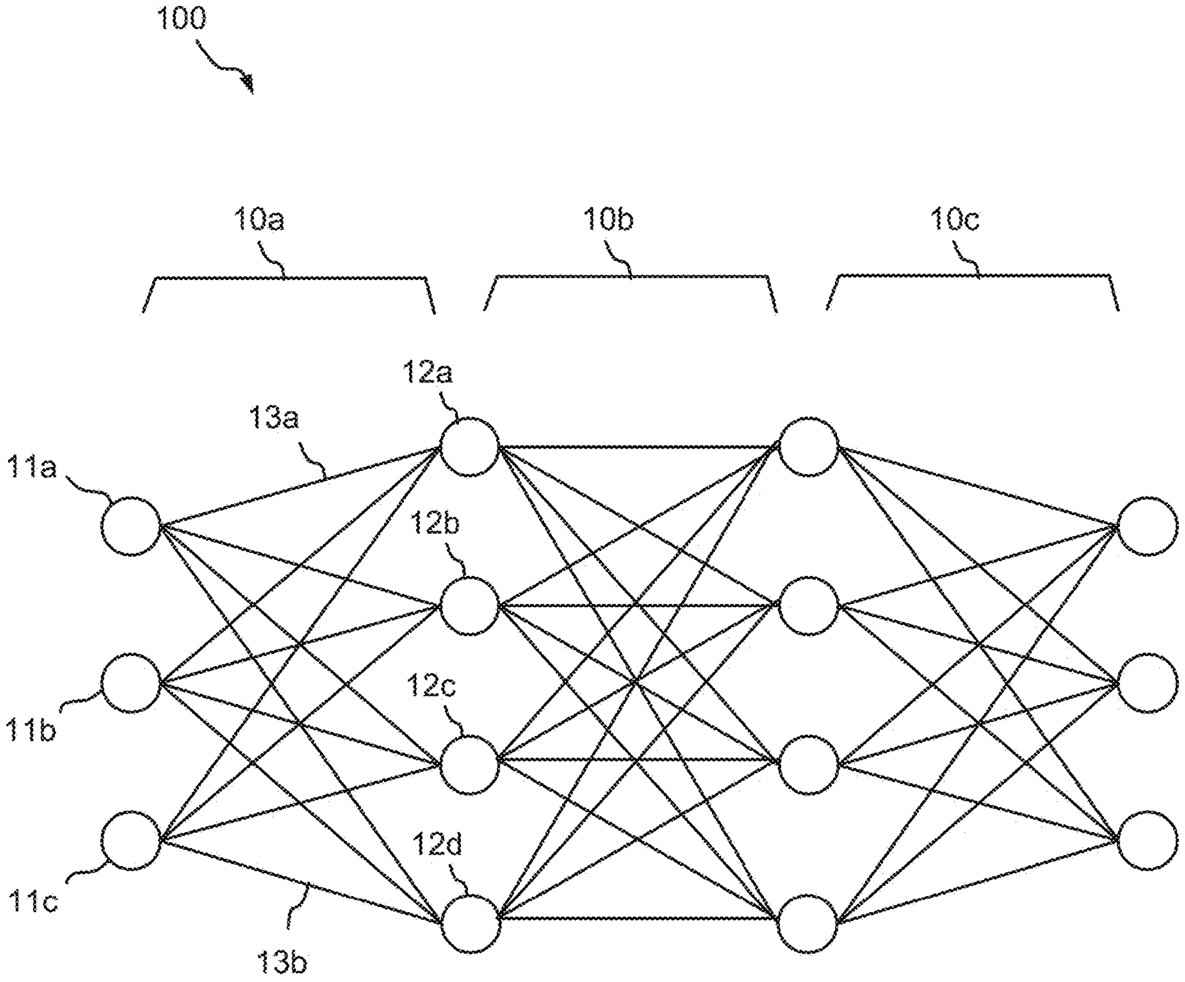
FIG. 1A shows an exemplary neural network architecture.

FIG. 1A shows an exemplary neural network architecture 100. The neural network architecture 100 comprises multiple layers, such as layers 10*a-c*. Each layer, such as layer 10*a* comprises one or more input neurons, such as neurons 11*a-c* and multiple output neurons such as neurons 12*a-d*. Each input neuron and output neuron are connected by synapses, such as synapses 13*a* and 13*b*. Each layer's output neurons, such as neurons 12*a-d* are the input neurons of the next layer, such as layer 10*b*. The neural network comprises any number of layers. Each layer comprises any number of neurons.

Figure 1B:
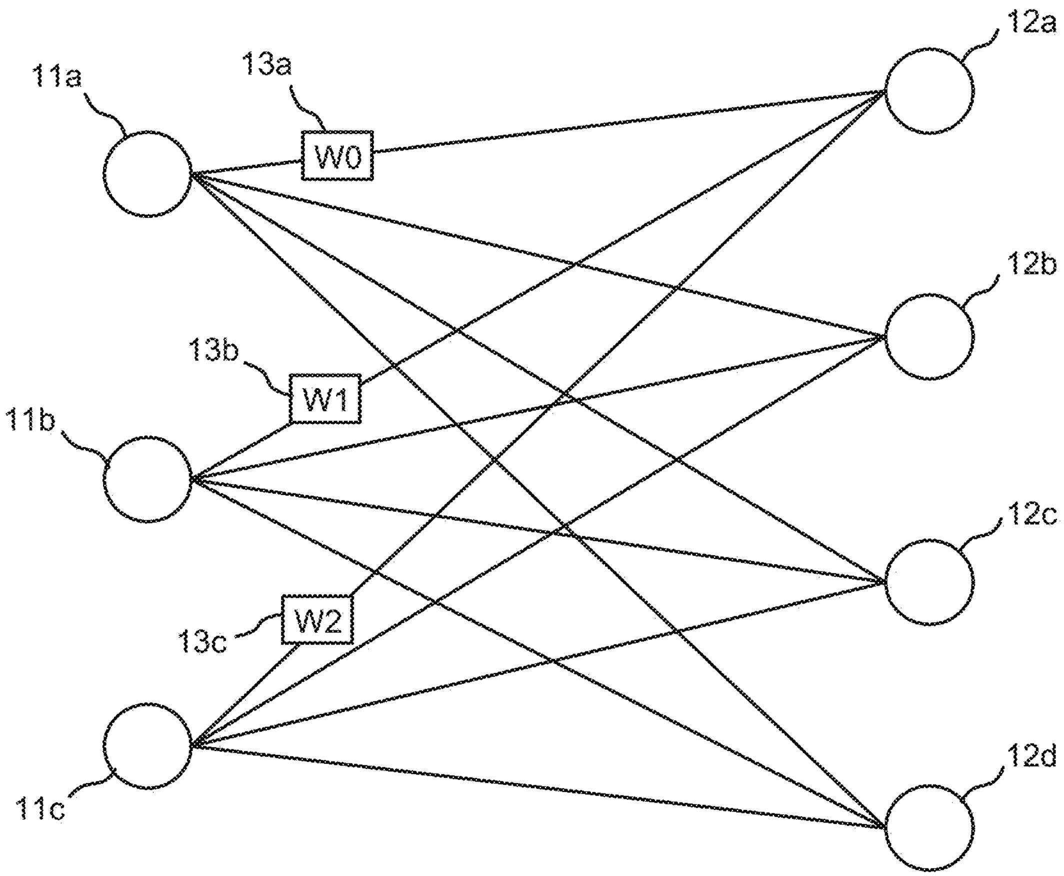
FIG. 1B shows an exemplary structure for one neural network layer for use in the architecture shown in FIG. 1A.

FIG. 1B shows an exemplary structure for one neural network layer, such as layer 10*a* shown in FIG. 1A. The layer 10*a* comprises input neurons 11*a-c* and output neurons 12*a-d*. Each input neuron is connected to each output neuron with a 'synapse'. Each synapse represents a 'weight', such as WO-2 shown by weights 13*a-c*, respectively.

Figure 1C:
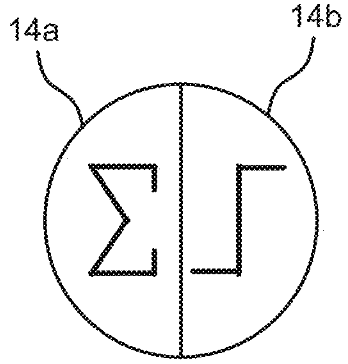
FIG. 1C shows exemplary functions of an output neuron.

FIG. 1C shows exemplary functions of an output neuron. The output neuron comprises a summation function 14*a* and an activation function 14*b*. The summation function 14*a* sums up weighted input signals received from a previous layer. The activation function 14*b* performs a threshold-like function to generate a non-linear output.

In various exemplary embodiments, a non-volatile memory array is configured to implement a neural network.

Figure 2A:
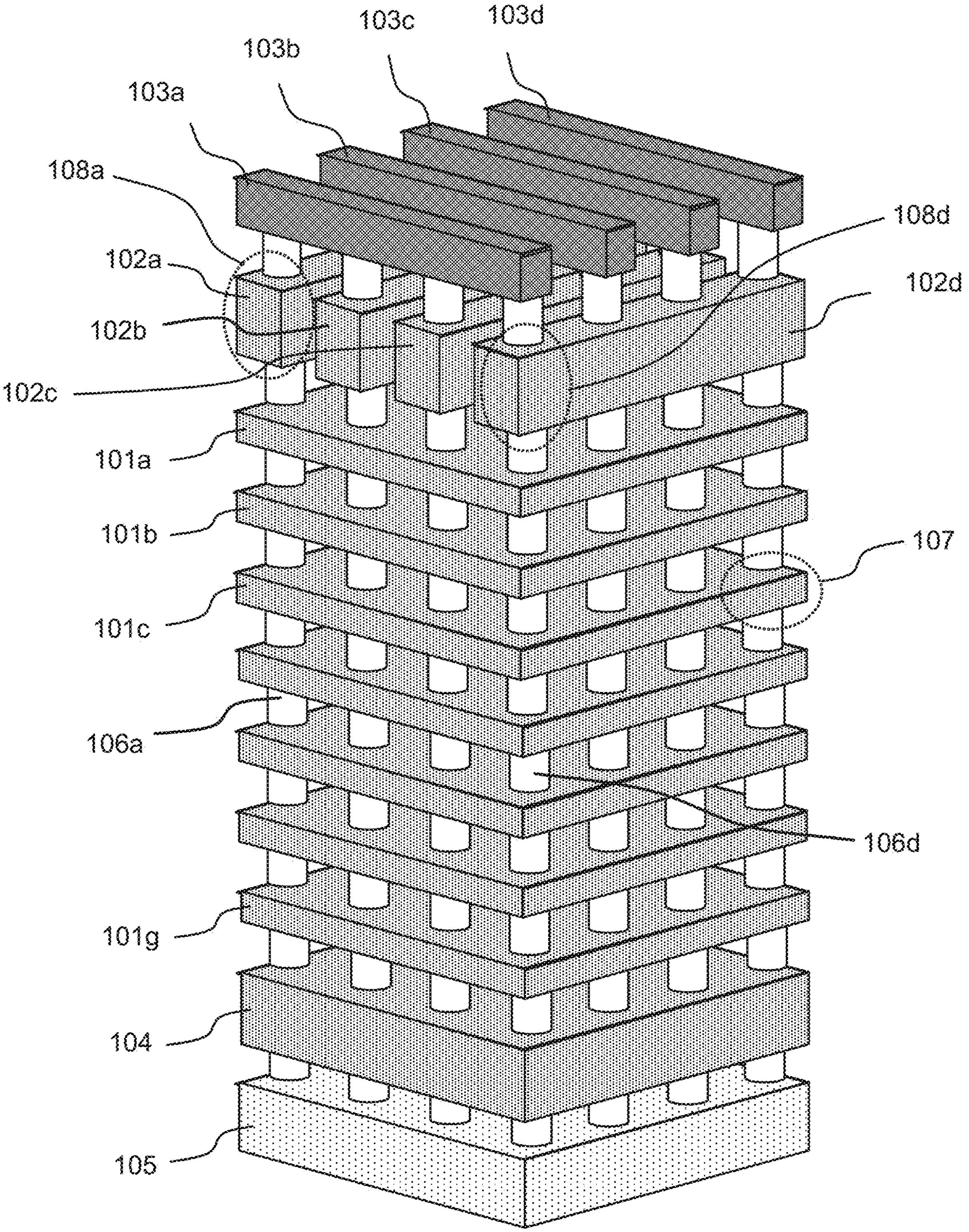
FIG. 2A shows an embodiment a neural network layer that is implemented using a 3D non-volatile memory array.
Figure 2B:
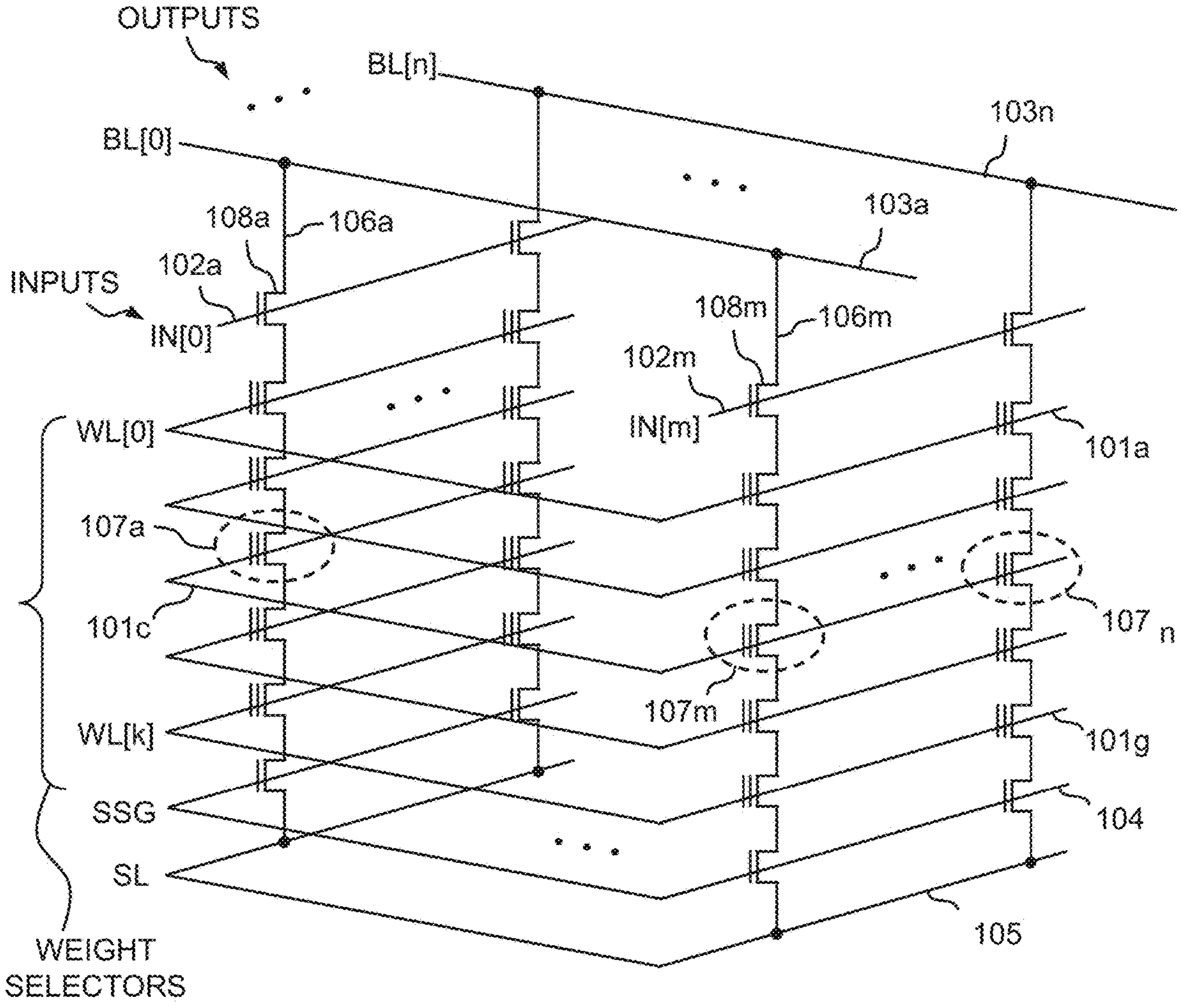
FIG. 2B shows an exemplary equivalent circuit of the 3D non-volatile memory array shown in FIG. 2A.

FIG. 2A shows an embodiment a neural network layer that is implemented using a 3D non-volatile memory array. The NAND array comprises multiple word line layers 101*a-g* and drain select gates 108*a-d*, which are connected to input neuron circuits as shown in FIG. 2B according to the invention. The NAND array also comprises bit lines 103*a-d* that are connected to output neuron circuits according to the invention. The bit lines 103*a-d* are also connected to vertical strings, such as strings 106*a-d*. Each intersection of a vertical string and a word line layer forms a memory cell, such as memory cell 107 that is formed at the intersection of the word line 101*a* and the vertical string 106*a*. The array also comprises a source select gate 104 and a source line 105.

FIG. 2B shows an exemplary equivalent circuit of the 3D non-volatile memory array shown in FIG. 2A. The drain select gates 108*a-m* are connected to input signals (IN[0-*m*]) 102*a-m*. When the input signals IN[0] to IN[m] are data 1 (VDD), this condition will turn on the drain select gates 108*a-m*. When the input signals IN[0] to IN[m] are data 0 (0V), this condition will turn off the drain select gates 108*a-m*. The input signals, IN[0] to IN[m] are applied from the outputs of a previous network layer. Depending on the data of the inputs, multiple ones of the drain select gates 108*a-m* may be turned on and other may be turned off.

The array contains multiple word line layers, such as word line layers 101*a-g*. For example, in advanced 3D non-volatile technology, the array comprises 128 word line layers. One word line layer is selected at one time. For example, assuming the word line layer 101*c* is selected, it will be supplied with a read voltage to read the cells 107*a-n*. The read voltage is between an on-cell's Vt (voltage threshold) and an off-cell's Vt. Meanwhile, the unselected word line layers are supplied with a pass voltage, which is higher than the off-cell's Vt. Thus, the cells on the unselect word line layers are turned on regardless if they are on-cells or off-cells. This allows the selected word line to read the selected cells.

The source line 105 is supplied with a fixed voltage, such as 0V or VDD. When it is supplied with 0V, the on-cells pass current from the bit lines 103*a-n* to the source line 105 to lower the bit line voltage. If the source line 105 is supplied with VDD, current flows from the source line 105 to the bit lines 103*a-n* through the on-cells to increase the bit line voltage. For simplicity, the following embodiments will use 0V supplied the source line for an example.

Embodiments of the invention may be applied to 'digital' or 'analog' neural networks. For digital neural network, the inputs are digital signals 0 (0V) or 1 (VDD). When the selected cell is an on-cell and the input data, IN[0] to IN[m], is 1 (VDD), the string will conduct current from the bit line. For an analog neural network, the inputs are analog voltages. The higher the input voltages and lower the cell Vt are, the higher current flow will be through the cell. Therefore, the cell current represent the 'multiplication' function of the synapses shown in FIG. 1B.

In FIG. 2B, each bit line 103*a-n* is connected to multiple strings 106*a-m* that represent the synapses. The selected cells 107*a-m* on the strings 106*a-m* represent the weights of the synapses. The inputs IN[0] to IN[m] 102*a-m* to the drain select gates 108*a-m* represent the input data. Each bit line 103*a-n* is connected to an output neuron circuit (not shown).

Figure 4A:
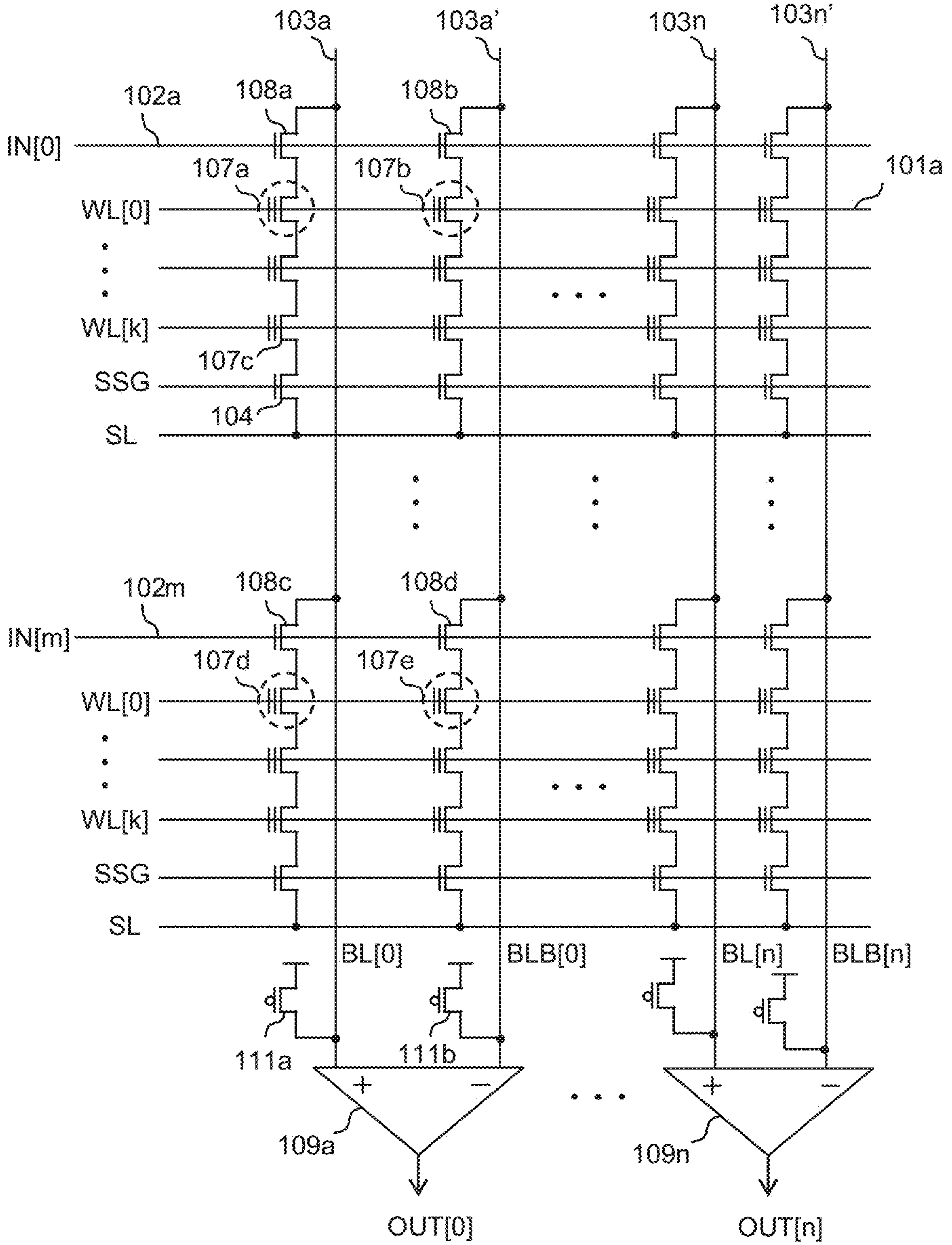
FIG. 4A shows an embodiment that uses a non-volatile memory array to implement 'negative weights'.
Figure 4B:
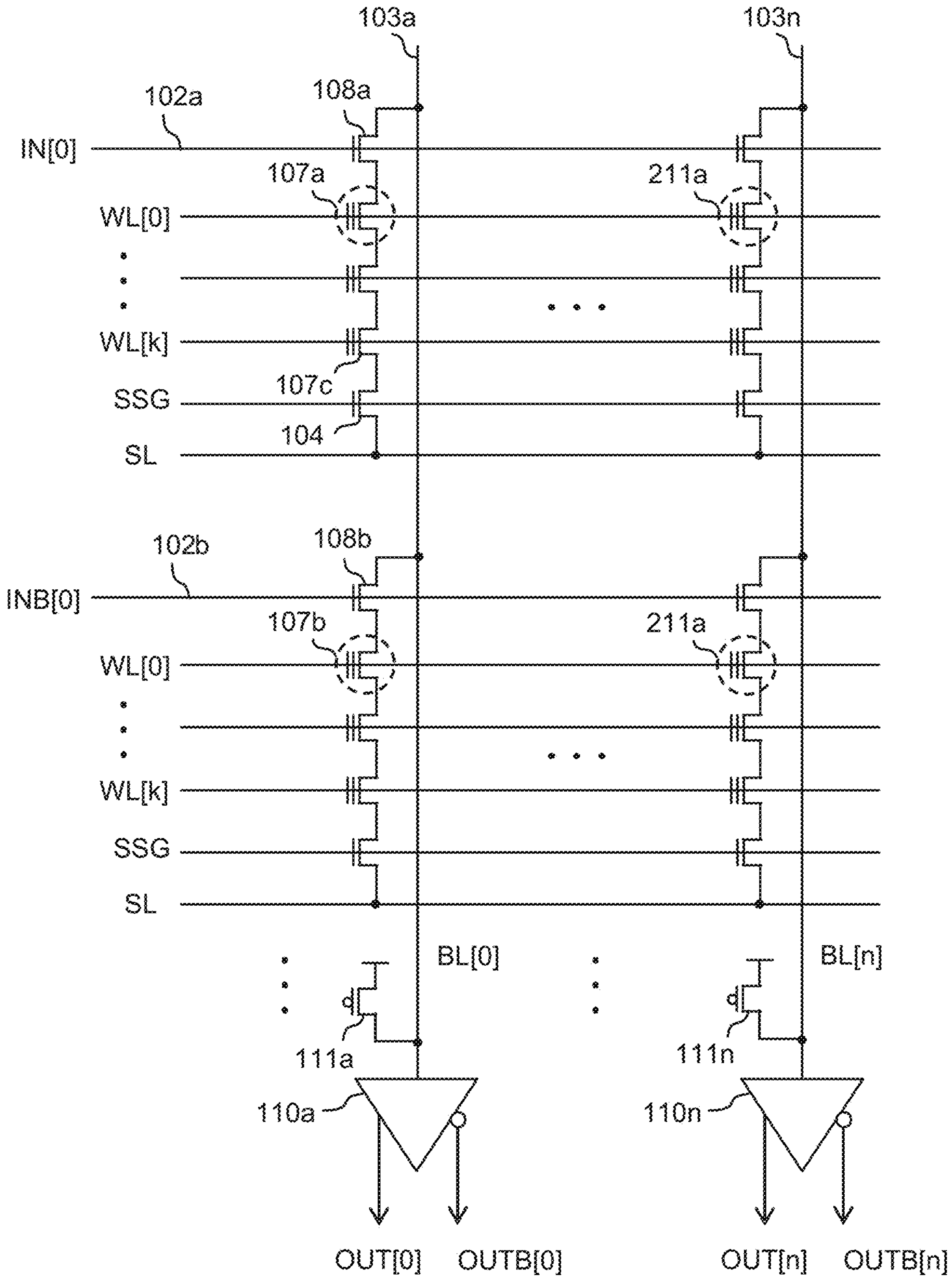
FIG. 4B shows another embodiment for implementation of negative weights in a neural network.

Referring now to an output neuron circuit shown in FIG. 4B. The output neuron circuit comprises pull-up devices 111*a-n* and comparators 110*a-n*. The pull-up devices 111*a-n* generate load currents to pull up the voltage of each bit line 103*a-n*.

For a non-volatile memory cell, the on-cell current is typically only one to several micro-amp (uA). Assuming each on-cell conducts 1 uA, then when there are N cells turned on, the sum of the current will be N×1 uA. This represents the 'summation' function 14*a* of the neural networks shown in FIG. 1C. When there is no string turned on or the sum of the on-cell current is lower than the load current of the pull-up devices 111*a-n*, the bit line voltage will be pulled high by the pull-up device. When the sum of the on-cells' discharging current is higher than the load current of the pull-up device, they will pull low the bit line voltage. The bit line voltage is applied to the inputs of the comparator circuits 110*a-n* to generate the outputs. This represents the 'threshold' function 14*b* of the output neuron in neural networks shown in FIG. 1C.

Referring again to FIG. 2B, the 3D non-volatile memory array implements a neural network layer having inputs IN[0-*m*], outputs BL[0-*n*], synapses (cell strings 106*a-m*), and weights (cells 107*a-m*) according to the invention.

In the neural network shown in FIG. 1B, the synapses may have positive or negative values for the weight. With a positive weight, the higher input results in higher output. For a negative weight, the higher input results in lower output.

Embodiments of the array can be used to implement digital or analog neural networks. For digital neural networks, the inputs and outputs are VDD or 0V for data 1 or 0, respectively. The cells have on-cell or off-cell states only.

Figure 3A:
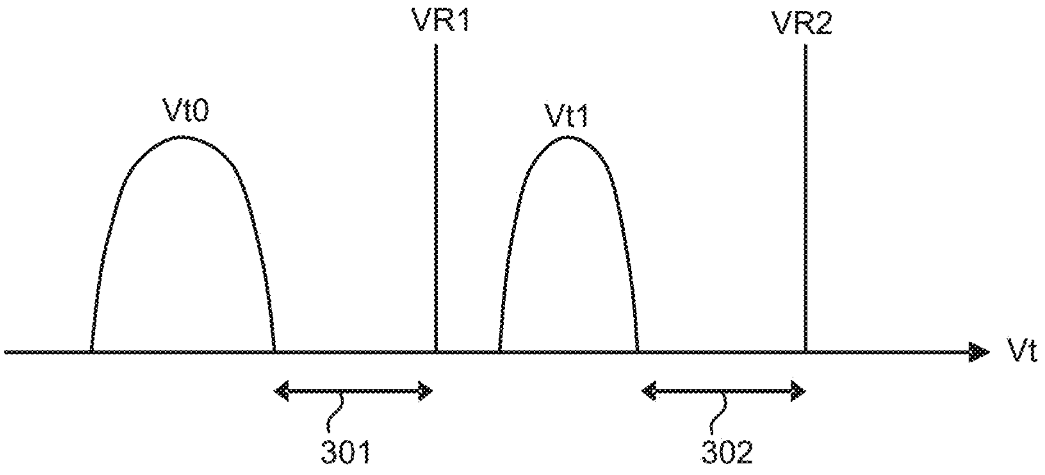
FIG. 3A shows an embodiment of Vt distribution for cells in digital neural networks.

FIG. 3A shows an embodiment of Vt distribution for cells in digital neural networks. The voltage thresholds Vt0 and Vt1 are for on-cell and off-cell Vt distributions, respectively. The selected word line is supplied with voltage VR1, which is between Vt0 and Vt1. Therefore, the VR1 voltage will turn on the Vt0 cells and turn off Vt1 cells. The unselected word lines are supplied with voltage VR2, which is higher than Vt1. Thus, the voltage VR2 will turn on the unselected cells regardless if they are on-cells or off-cells. It should be noted that as the cell's current is linearly proportional to its (V−Vt) voltage, the minimal (VG−Vt) voltage for on-cells is shown at indicator 301 and the minimal (VG−Vt) voltage for off-cells is shown at indicator 302. Normally the voltage shown at indicator 302 is equal to or greater than the voltage shown at indicator 301, in order to prevent the unselected cells from limiting the selected cell's current.

Figure 3B:
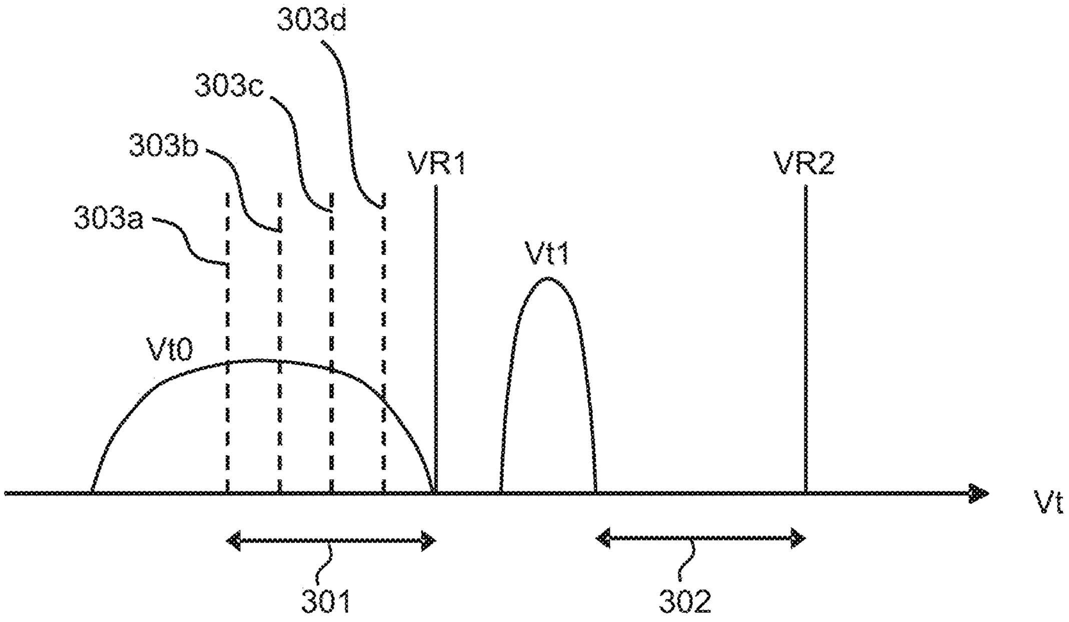
FIG. 3B shows an embodiment of Vt distribution for cells in analog neural networks.

FIG. 3B shows an embodiment of Vt distribution for cells in analog neural networks. The distribution shown in FIG. 3B is similar to the distribution shown in FIG. 3A except that the upper range of Vt0 is extended from indicator 303*a* to indicator 303*d* as shown. Because the (VG−Vt) voltage for the cells in 303*a* to 303*d* is lower than 301, the cells with Vt value from 303*b* to 303*d* will conduct current lower than the cell in 303*a*. Therefore, the cells in 303*b* to 303*d* will limit the current and result in 'analog weights'.

For example, assume the voltages indicated at 301 and 302 are equal and the cell current for the cell in 303*a* is Icell. The cells in 303*b* to 303*d* will conduct 0.75×Icell, 0.5×Icell, and 0.25×cell, respectively, due to their (VG−Vt) being 75%, 50%, and 25% of the voltage 301, respectively. The current of the cells' Vt below 303*a* will be limited at Icell because their (VG−Vt) is higher than the (VG−Vt) voltage 302 of the unselected cell, thus the current will be limited by the unselected cells. Therefore, 4 Vt levels for the cells in 303*a* to 303*d* for analog weights are achieved.

For example, in one embodiment, assuming VR1 and VR2 are 2V and 6V, respectively. The Vt1 range is 3V to 4V. The minimal (VG−Vt) voltage 302 for unselected cells is 2V. The voltage range 301 shall be the same as 302 which is 2V. Therefore, the voltage 303*a* will be 0V. Assuming the cells in 303*b* to 303*d* conduct 75%, 50%, and 25% of the current of the cell in 303*a*, the voltages 303*a* to 303*d* are 0V, 0.5V, 1.0V, and 1.5V, respectively. By using this configuration, the analog Vt levels of the cells can be determined.

Figure 3C:
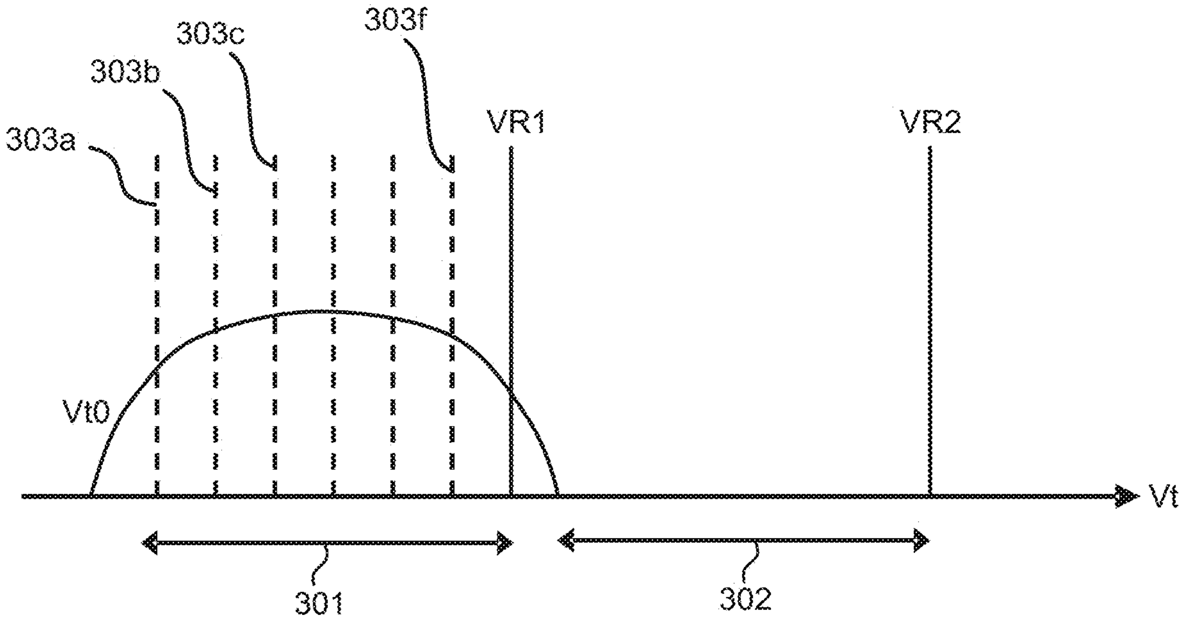
FIG. 3C shows another embodiment of Vt distribution for cells in analog neural networks.

FIG. 3C shows another embodiment of Vt distribution for cells in analog neural networks. In this embodiment, there is no Vt1 state. The off-cell is represented by the cells' Vt being higher than VR1. This distribution increases the minimal (VG−Vt) voltage 302 of the unselected cells, and thus it increases the voltage range of 301. This allows more Vt levels for the analog weights.

For example, in one embodiment, VR1 and VR2 are 2.5V and 6V, respectively. The upper range if the Vt0 distribution is 3V. The minimal (VG−Vt) voltage 302 for the unselected cells is 3V. Therefore, the Vt for 303*a* to 303*f* is0.5V, 0V, 0.5V, 1.0V, 1.5V, 2.0V, respectively. This increases the number of the analog Vt levels to six.

Figure 3D:
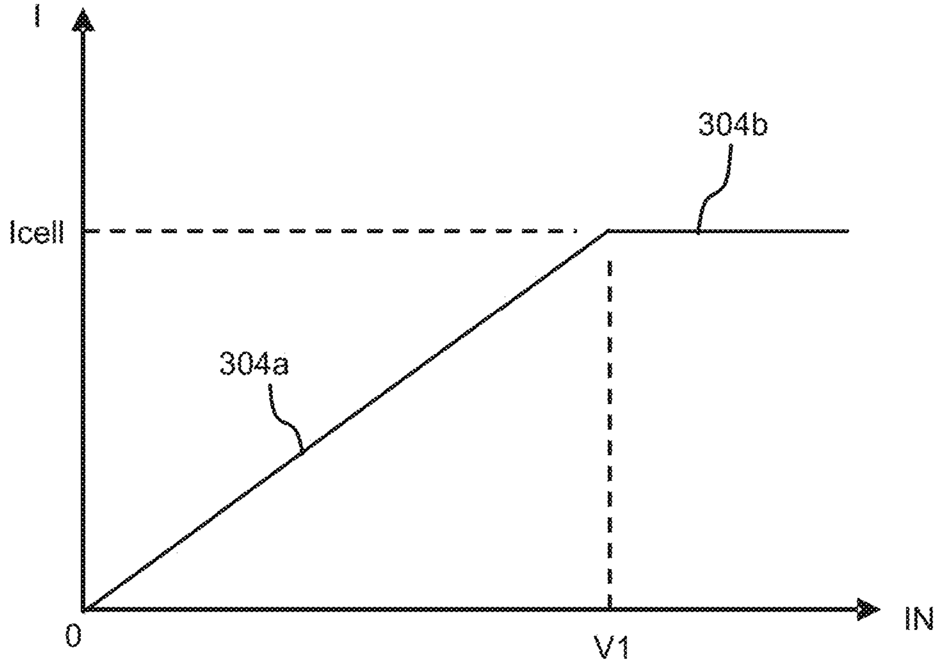
FIG. 3D shows input levels for analog neural networks.

FIG. 3D shows input levels for analog neural networks. The input of the drain select gate may be supplied with an analog voltage from 0V to V1 as shown in FIG. 3D to conduct current from 0V to the maximal on-cell cell, as shown in 304*a*. When the input voltage is higher than V1, the current is limited by the cell-current, as shown at 304*b*. Consequently, by using the configurations shown in FIGS. 3B-D, analog neural networks can be implemented.

FIG. 4A shows an embodiment that uses a non-volatile memory array to implement 'negative weights'. In this embodiment, the array can be implemented using 2D or 3D non-volatile memory array. As described with reference to FIG. 2B, the input signals, IN[0] 102*a* to IN[m] 102*m*, are connected to the drain select gates 108*a* to 108*d*, etc. The input signals, IN[0] to IN[m], are from the outputs of the previous layer.

In an embodiment, output neuron circuits 109*a-n* can be implemented by comparators as shown. The bit lines are configured into BL and BLB pairs. BL[0] 103*a* to BL[n] 103*n* are connected to the positive input of the comparators 109*a* to 109*n*, respectively. BLB[0] 103*a*' to BLB [n] 103*n*' are connected to the negative input of the comparators, respectively. The devices 111*a* and 111*b* are pull-up devices.

When IN[0] 102*a* is VDD, this condition will turn on both the drain select gates 108*a* and 108*b*. Assuming WL[0] 101*a* is selected, if the cell 107*a* is an on-cell, cell 107*a* will be turned on and conduct current from BL[0], which will cause OUT[0] to go higher, because BL[0] is connected to the positive input of the comparator 109*a*. Therefore, the cell 107*a* represents a negative weight.

On the other hand, if the cell 107*b* is an on-cell, it will conduct current from BLB[0], which will cause OUT[0] to go higher, because BLB [0] is connected to the negative input of the comparator 109*a*. Therefore, the cell 107*b* represents a positive weight. By using this array, the positive and negative weights of a neural network can be implemented.

FIG. 4B shows another embodiment for implementation of negative weights in a neural network. In this embodiment, the output neuron uses a single-ended comparator, as shown at 110*a* to 110*n*. The inputs are configured as pairs, IN and INB, which are supplied with complementary data. For a digital design, when IN[0] is VDD, INB[0] is 0V. When IN[0] is 0V, INB[0] is VDD. FIG. 4B only shows one input pair, IN[0] and INB[0], for illustration. In real applications, the array may contain multiple input pairs such as IN[0] to IN[m] and INB[0] to INB[m].

When IN[0] and INB[0] are VDD and 0V, respectively, the drain select gate 108*a* will be turned on and 108*b* will be turned off. If the cell 107*a* is an on-cell, it will conduct current from BL[0] to make OUT[0] lower. Therefore, the cell 107*a* is a negative weight. When IN[0] and INB[0] are 0V and VDD, respectively, the drain select gate 108*a* will be turned off and 108*b* will be turned on. If the cell 107*b* is an on-cell, it will conduct current from BL[0] to make OUT[0] lower. Therefore, the cell 107*b* is a positive weight.

Figure 5A:
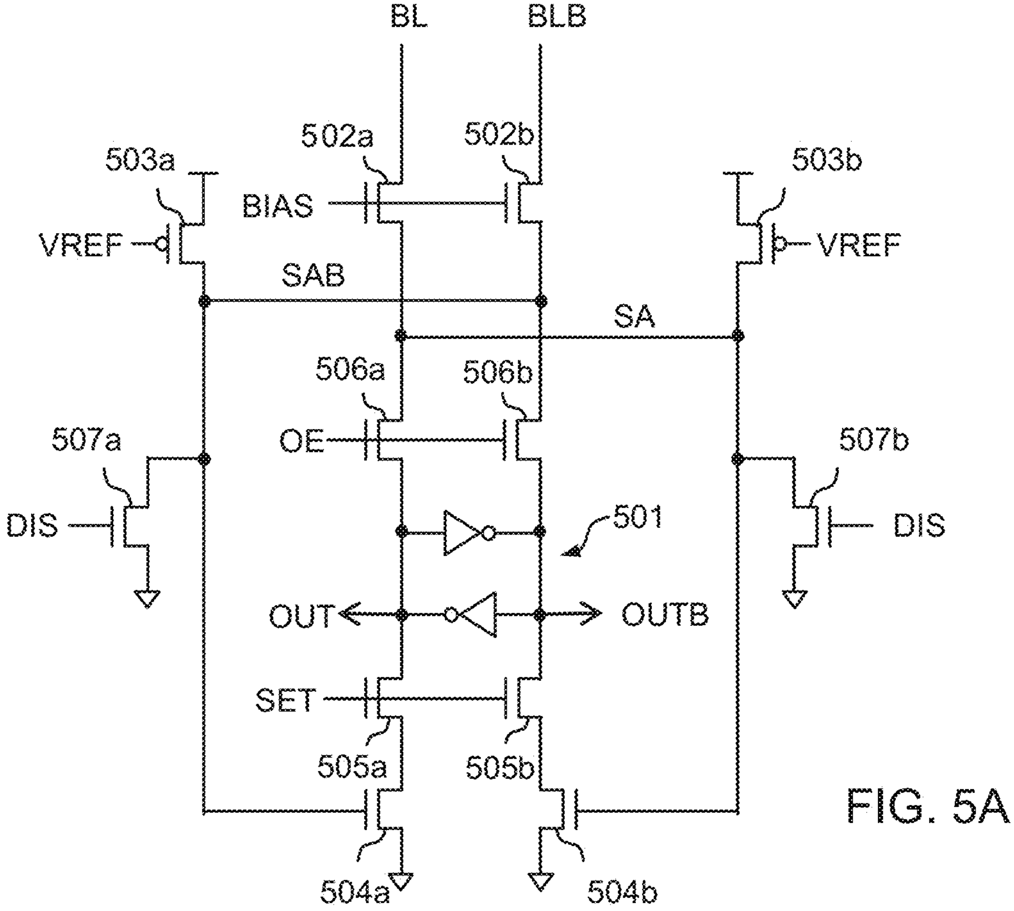
FIG. 5A shows an embodiment of a dual-input neuron circuit according to the invention.

FIG. 5A shows an embodiment of a dual-input neuron circuit according to the invention. For example, the dual-input neuron circuit shown in FIG. 5A is suitable for use as the circuits 109*a* to 109*n* shown in FIG. 4A. The BL and BLB are connected to the pull-up devices 503*a* and 503*b* through the bias devices 502*a* and 502*b*. The pull-up devices 503*a* and 503*b* are supplied with a reference voltage, VREF, to control the pull-up current. The pull-up currents of the devices 503*a* and 503*b* represent the 'threshold' function of the output neuron, as shown by the threshold function 14*b* in FIG. 1C. The current can be adjusted by adjusting the voltage VREF.

When the sum of the cell current in the bit line BL is higher than the pull-up current, the SA node will be pulled lower than Vt of the device 504*b*. A SET pulse is applied to turn in the set device 505*b* to pull low the OUTB node and pull high the OUT node of the latch 501.

During back-propagation, the target data are applied to the SA and SAB nodes. A SET pulse is applied to turn on the devices 505*a* and 505*b* to latch the data into the data latch 501. Then, an OE pulse is applied to turn on the output devices 506*a* and 506*b* to apply OUT and OUTB data to BL and BLB, respectively. The BIAS signal is applied with a level of VDD or VDD+Vt to turn on the devices 502*a* and 502*b* to fully pass the data to the bit lines. Then, the selected word line (not shown) is supplied with a high voltage, such as 20V to program the cells. If the bit line is supplied with 0V, the cell will be programmed to increase its Vt. If the bit line is supplied with VDD, the cell will be inhibited from programming.

The circuit also comprises disable devices 507*a* and 507*b*. In accordance with the invention, the number of the neurons in each layer can be freely adjusted to configure the neural network. The unselected neurons can be disabled by the device 507*a* and 507*b*.

It should be noted that the embodiment shown in FIG. 5A is not limiting and that there are many other ways to modify and implement the neuron circuit. For example, in another embodiment, the neuron circuit is modified from the sense amplifier circuit used in DRAM (dynamic random-access memory) or SRAM (static random-access memory). These variations and modification shall remain in the scope of the invention.

Figure 5B:
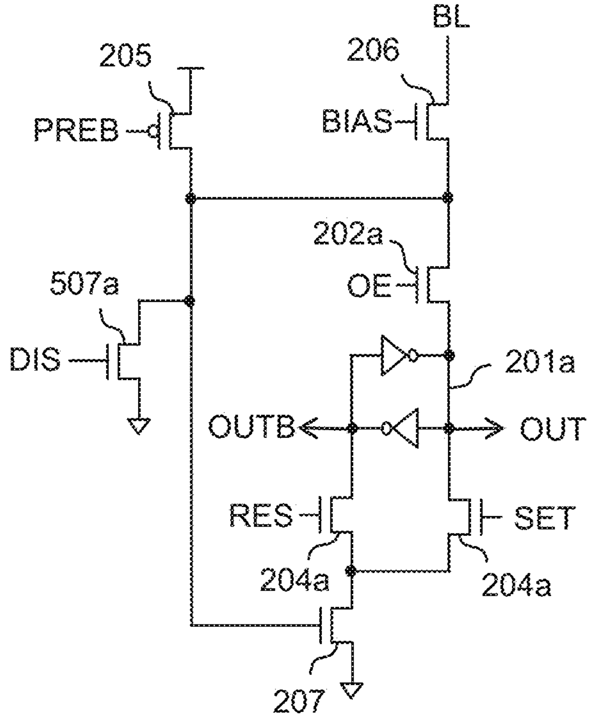
FIG. 5B shows an exemplary single-ended neuron circuit.

FIG. 5B shows an exemplary single-ended neuron circuit. For example, the neuron circuit shown in FIG. 5B is suitable for use as the circuits 110*a-n* shown in FIG. 4B. This embodiment is similar to the one shown in FIG. 5A, except that the circuit is only connected to one bit line. The operation of this circuit is similar to the one shown in FIG. 5A. Please refer to the description for FIG. 5A for detailed operations.

Figure 6A:
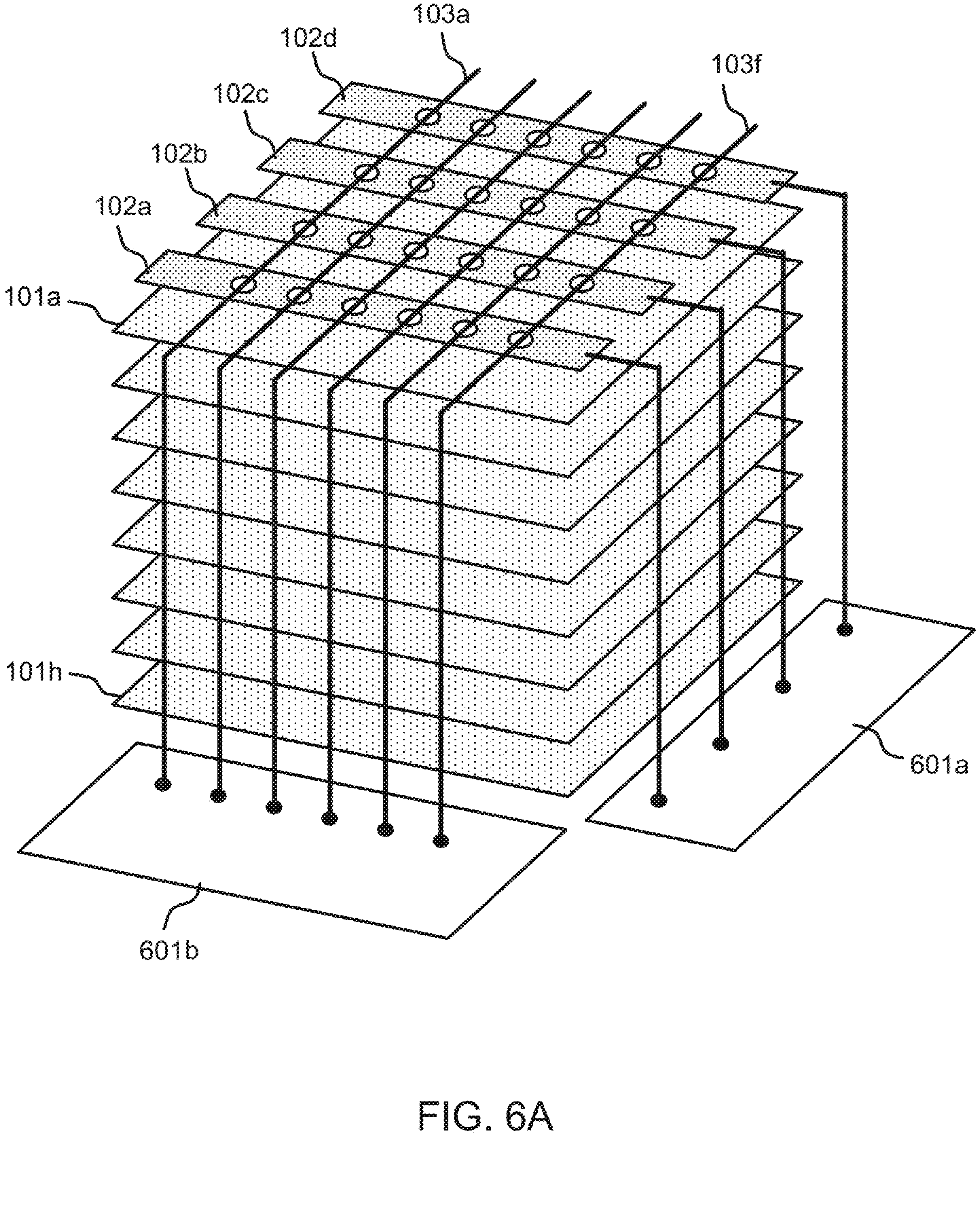
FIGS. 6A-B show embodiments of a 3D non-volatile neural network array architecture and neuron circuit layout according to the invention.
Figure 6B:
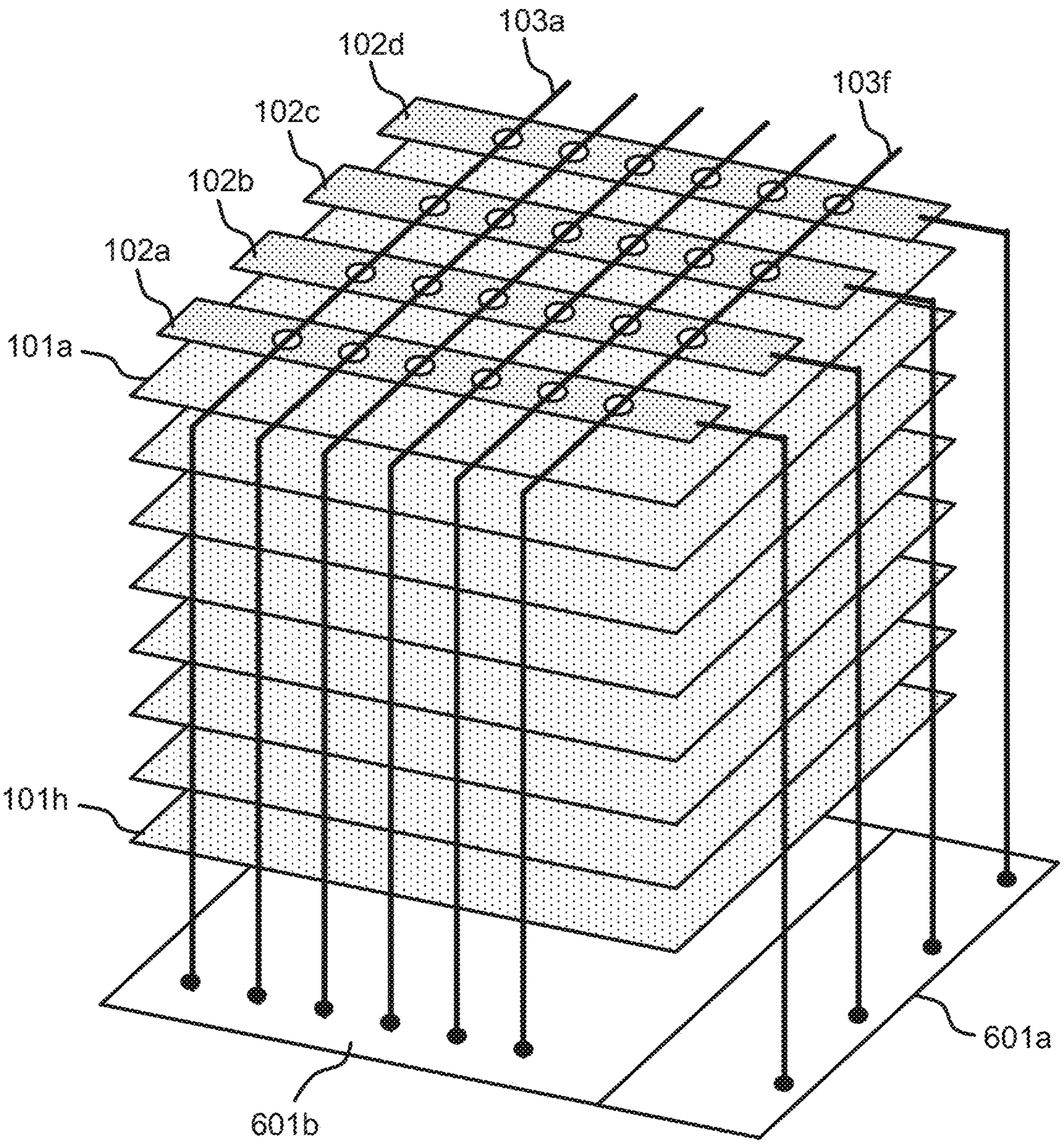

FIGS. 6A-B show embodiments of a 3D non-volatile memory neural network array architecture and neuron circuit layout according to the invention to represent one layer of the neural network as shown in FIGS. 1B-C. The array comprises word line layers 101*a-h* and drain select gates 102*a-d* that are connected to the input neuron circuit 601*a*. Bit lines 103*a-f* are connected to the output neuron circuit 601*b*. During operations, as demonstrated in FIGS. 4A-B, the input neuron circuit 601*a* applies inputs to the drain select gates 102*a-d*. One word line layer is selected from the multiple word line layers 101*a-h* to provide weights using the non-volatile memory cells. The inputs 102*a-d* and the weights of the cells will determine the voltages of the bit lines 103*a-f*. The bit lines 103*a-f* are connected to the output neuron circuits 601*b* to generate the outputs. The multiple word line layers 101*a-h* can store different weights for different applications, and one layer is selected each time to provide the weights for the desired application.

FIG. 6A shows an exemplary embodiment of an array implemented using non-CUA (CMOS under array) technology. In this technology, the word line layers 101*a-h* are located on top of the substrate, therefore, the neuron circuits cannot be located under the array. The neuron circuits 601*a* and 601*b* are located around the array as shown.

FIG. 6B shows another exemplary array structure using CUA technology. In this technology, the array shown in FIG. 6B is located in the back-end of line (BEOL) layers instead of the substrate. The neuron circuits 601*a* and 601*b* are located under the array as shown, thus the die size may be reduced.

Figure 7A:
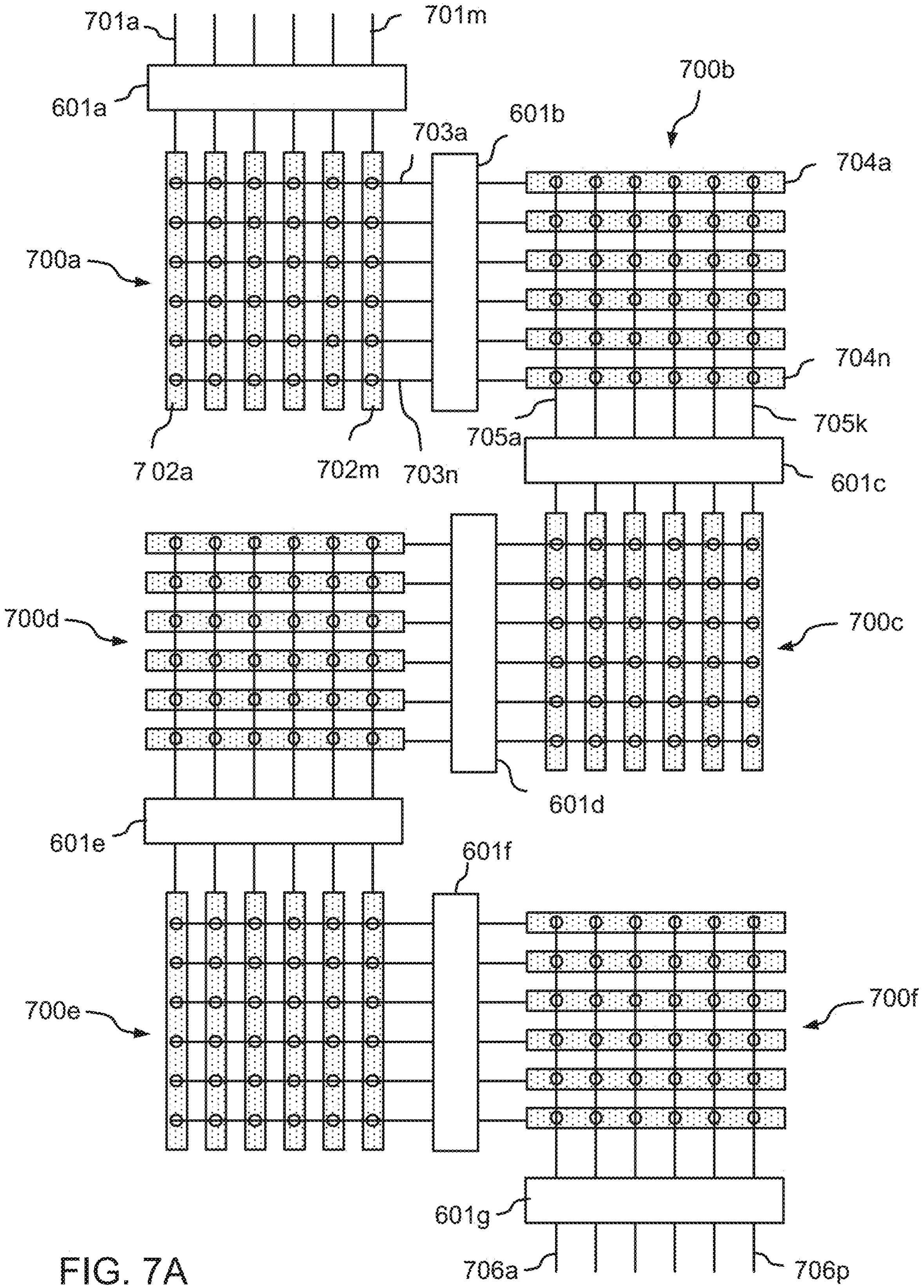
FIG. 7A shows an exemplary embodiment of a multiple-layer neural network structure according to the invention.

FIG. 7A shows an exemplary embodiment of a multiple-layer neural network structure according to the invention. This embodiment comprises six 3D array structures shown in FIGS. 6A-B, as shown by 700*a* to 700*f*. The top view of the array is shown in FIG. 7A and illustrates a first neural network layer 700*a* to a sixth neural network layer 700*f*. The drain select gates, such as 702*a-m*, and bit lines, such as 703*a-m*, for the first array structure 700*a* are shown. The word line layers, such as 101*a-h* shown in FIGS. 6A-B, are not shown in FIG. 7A. Also shown are neuron circuits 601*a-g* where the neuron circuit 601*a* and 601*b* are the input neuron circuits of the first array structure 700*a*, respectively.

The multiple-layer neural network receives inputs 701*a* to 701*m* from an external system or previous neural network layer. In the first layer 700*a* of the neural network, the neuron circuit 601*a* applies the inputs to the drain select gates 702*a* to 702*m* of the first layer 700*a*. One word line layer (not shown) is selected to provide the weights. The bit lines 703*a* to 703*n* are connected to the output neuron circuit 601*b* of the first layer. In the second layer 700*b* of the neural network, the outputs of the neuron circuit 601*b* are connected to the drain select gates 704*a* to 704*n* of the second layer 700*b*. The bit lines 705*a* to 705*k* are connected to the output neuron circuit 601*c*. The other layers, such as 700*c* to 700*f*, of the neural network are similarly connected as described above.

As a result, the input signals 701*a* to 701*m* are propagated through the multiple neural network layers from the first layer 700*a* through the layers 700*b*, 700*c*, 700*d*, 700*e*, 700*f*, and then to the outputs 706*a* to 706*p* of the output neuron 601*g*.

It should be noted that the embodiment shown in FIG. 7A only six neural network layers are shown for illustration. However, using this architecture, any number of neural network layers can be implemented.

Figure 7B:
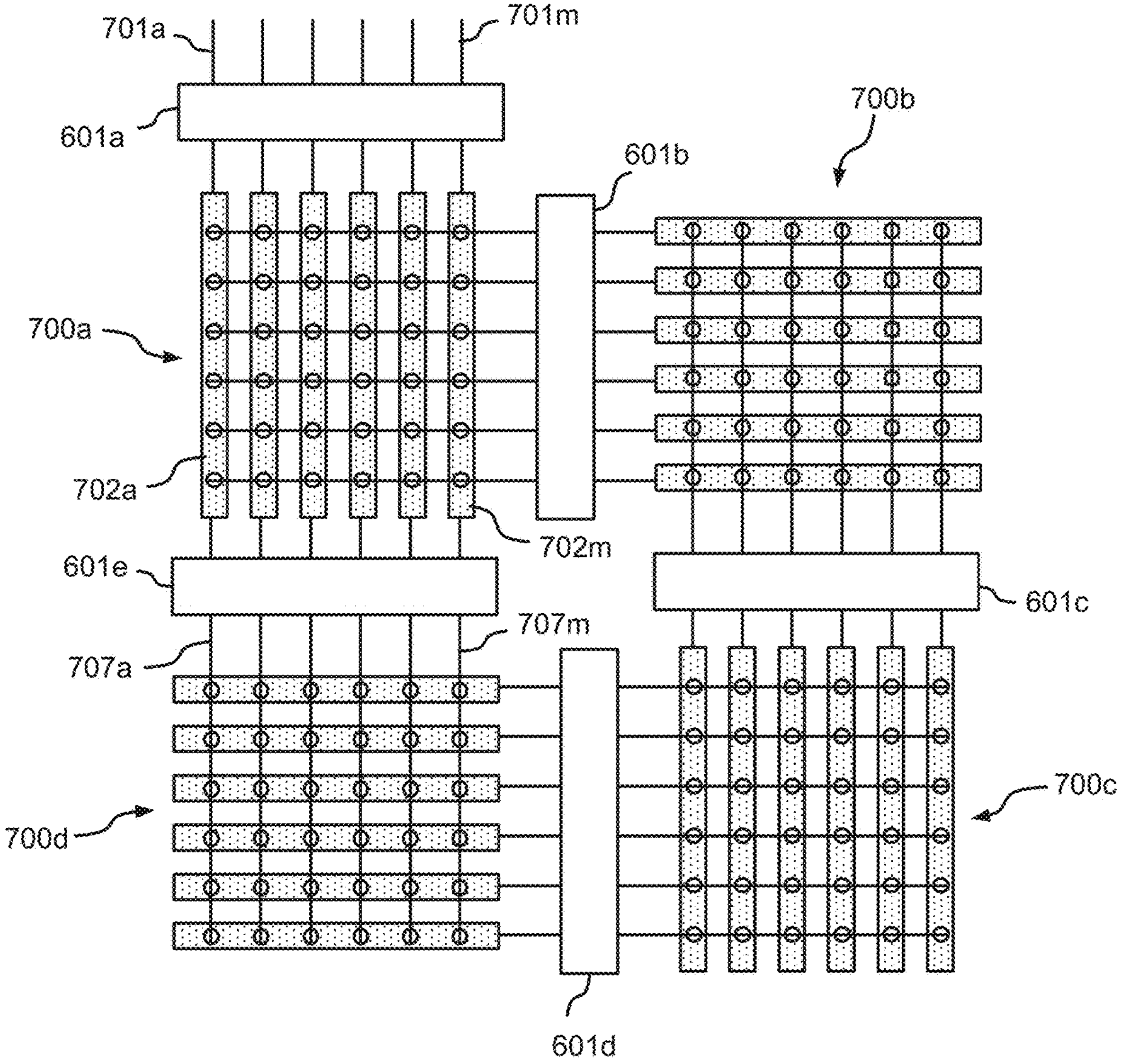
FIG. 7B shows another embodiment of the multiple-layer neural network structure according to the invention.

FIG. 7B shows another embodiment of the multiple-layer neural network structure according to the invention. The neural network layers 700*a* to 700*d* are shown. Each layer comprises a 3D array structure shown in FIGS. 6A-B. This embodiment is similar to the one shown in FIG. 7A except that the outputs of the fourth (last) layer 700*d* are fed back to the first layer 700*a*. The outputs of the neuron circuit 601*e* are connected to the drain select gates 702*a* to 702*m* of the first layer. This forms a close-loop neural network. When the signals are propagated from the first layer 700*a* to the fourth (last) layer 700*d*, the input neuron circuit 601*a* is disabled to allow the drain select gates 702*a* to 702*m* to be driven by the neuron circuit 601*e* instead of 601*a*. Therefore, the outputs from the last layer 700*d* becomes the inputs of the first layer 700*a*. This operation is called one cycle.

In the second cycle, the second word line layer of each neural network layer 700*a* to 700*d* is selected to select the second group of cells (weights). Then, the output signals from the fourth layer 700*d* may be propagated from the first layer 700*a* to the fourth layer 700*d* again. This equals to propagating the outputs through the fifth to the eighth layers. Then, the outputs from the last layer 700*d* may be fed back to the first layer 700*a* to start the third cycle. The third word line layer of the arrays 700*a* to 700*d* is selected to select the third group of cells (weights), and the signals are propagated from the layers 700*a* to 700*d* again. This equals to propagating the outputs through the ninth to the twelfth layers. This process may be repeated as many cycles as desired. This embodiment allows the neural network to have any number of layers, by using only four array structures 700*a* to 700*d*. Each cycle equals to four neural network layers. Assuming the signal propagation is repeated for N cycles, the total number of neural network layers equal to 4×N layers.

Figure 7C:
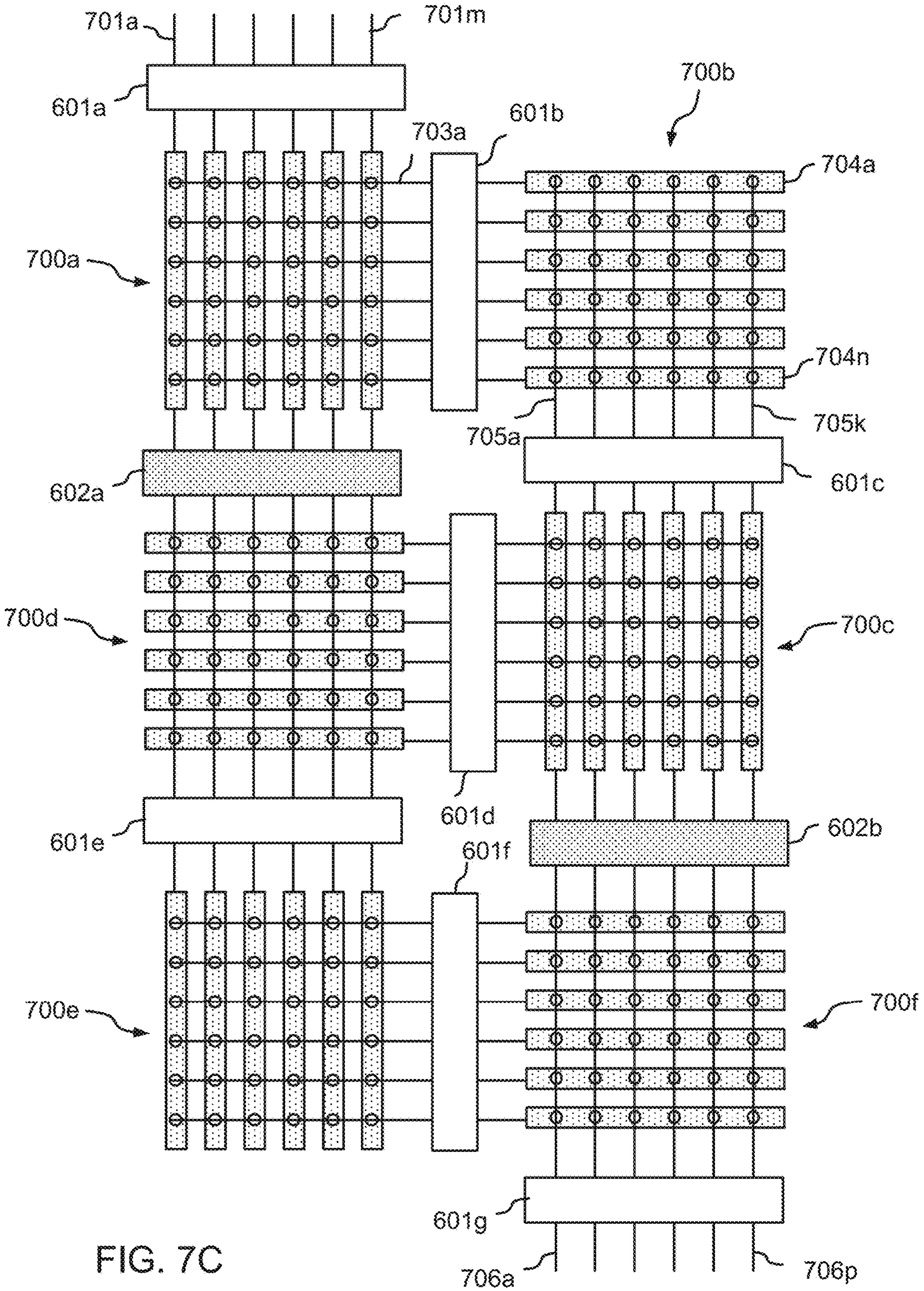
FIG. 7C shows another embodiment of a multiple-layer neural network structure according to the invention.

FIG. 7C shows another embodiment of a multiple-layer neural network structure according to the invention. This embodiment is similar to the one shown in FIG. 7A except that additional 'feedback' neuron circuits 602*a* and 602*b* are added.

During back-propagation, the feedback neuron circuit 602*b* allows the outputs of the layer 700*f* to be fed back to the layer 700*c* by turning on the feedback neuron circuit 602*b* and turn off the neuron circuit 601*c*. The feedback neuron circuit 602*a* allows the outputs of the layer 700*d* to be fed back to the layer 700*a* by turning on the feedback neuron circuit 602*a* and turning off the neuron circuit 601*a*. By using this process, each neuron layer can be fed back from the output of one layer to a previous layer to update the weights of the synapses (program the cells) during back-propagation.

Figure 8:
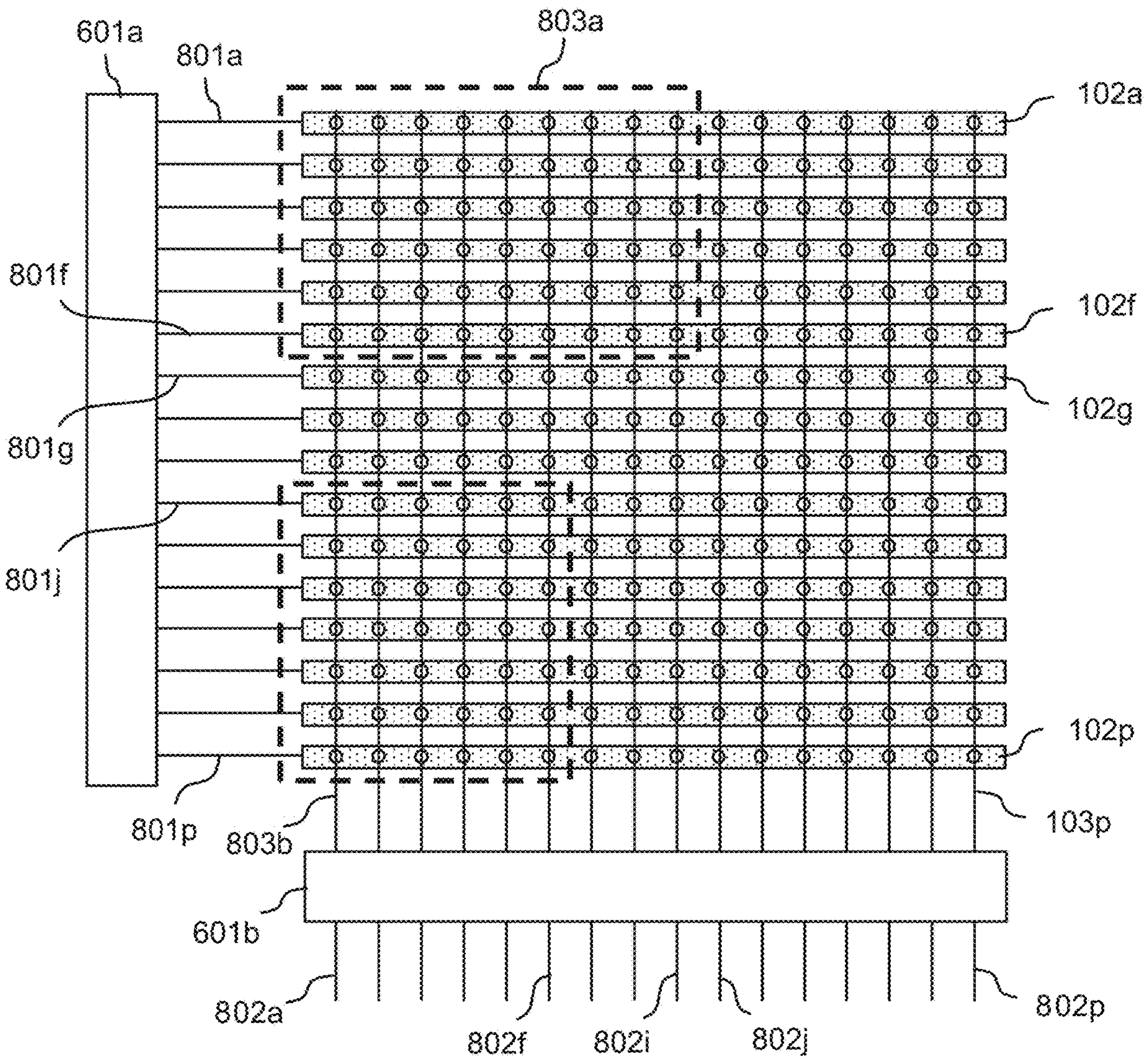
FIG. 8 shows an embodiment of a top view of a neural network layer and illustrates how the neuron number of each layer can be adjusted.

FIG. 8 shows an embodiment of a top view of a neural network layer and illustrates how the neuron number of each layer can be adjusted. The array layer includes an input neuron circuit 601*a* and output neuron circuit 601*b*. The array layer also includes drain select gates 102*a* to 102*p* and bit lines 103*a* to 103*p*. The array layer may contain a large number of drain select gates connected to the input neuron circuit, and a large number of bit lines connected to the output neuron circuit. In a real application, the array layer may only utilize a smaller number of input neurons and output neurons. The embodiment shown in FIG. 8 illustrates a method to adjust the number of the input neurons and output neurons for each layer.

It will be assumed that an application only needs the inputs 801*a* to 801*f*. The neuron circuits of 801*a* to 801*f* are enabled and send inputs to 801*a* to 801*f*. The neuron circuits of unselected inputs 801*g* to 801*p* are disabled and 0 volts is applied to 801*g* to 801*p*. This voltage level will turn off the drain select gates 102*g* to 102*p*. Referring to the embodiments of the neuron circuit shown in FIGS. 5A-B, the disable devices 507*a* and 507*b* may be turned on to apply 0V to the unselected inputs.

In the output neuron circuit 601*b*, assuming the application only need the outputs 802*a* to 802*i*, the neuron circuits of 802*a* to 802*i* are enabled. The neuron circuits of the unselected outputs 802*j* to 802*p* are disabled and apply 0V to 802*j* to 802*p*. This will turn off the drain select gates connected to 802*j* to 802*p* in the next layer. As a result, the group of cells 803*a* is selected to perform a synapse function.

Similarly, when the neuron circuits for the inputs 801*j* to 801*p* and the outputs 802*a* to 802*f* are enabled, and the other inputs and outputs are disabled, the group of cells 803*b* is select to perform the synapse function. By using the process illustrated in FIG. 8, the number of input and output neurons of each layer can be freely adjusted.

Figure 9A:
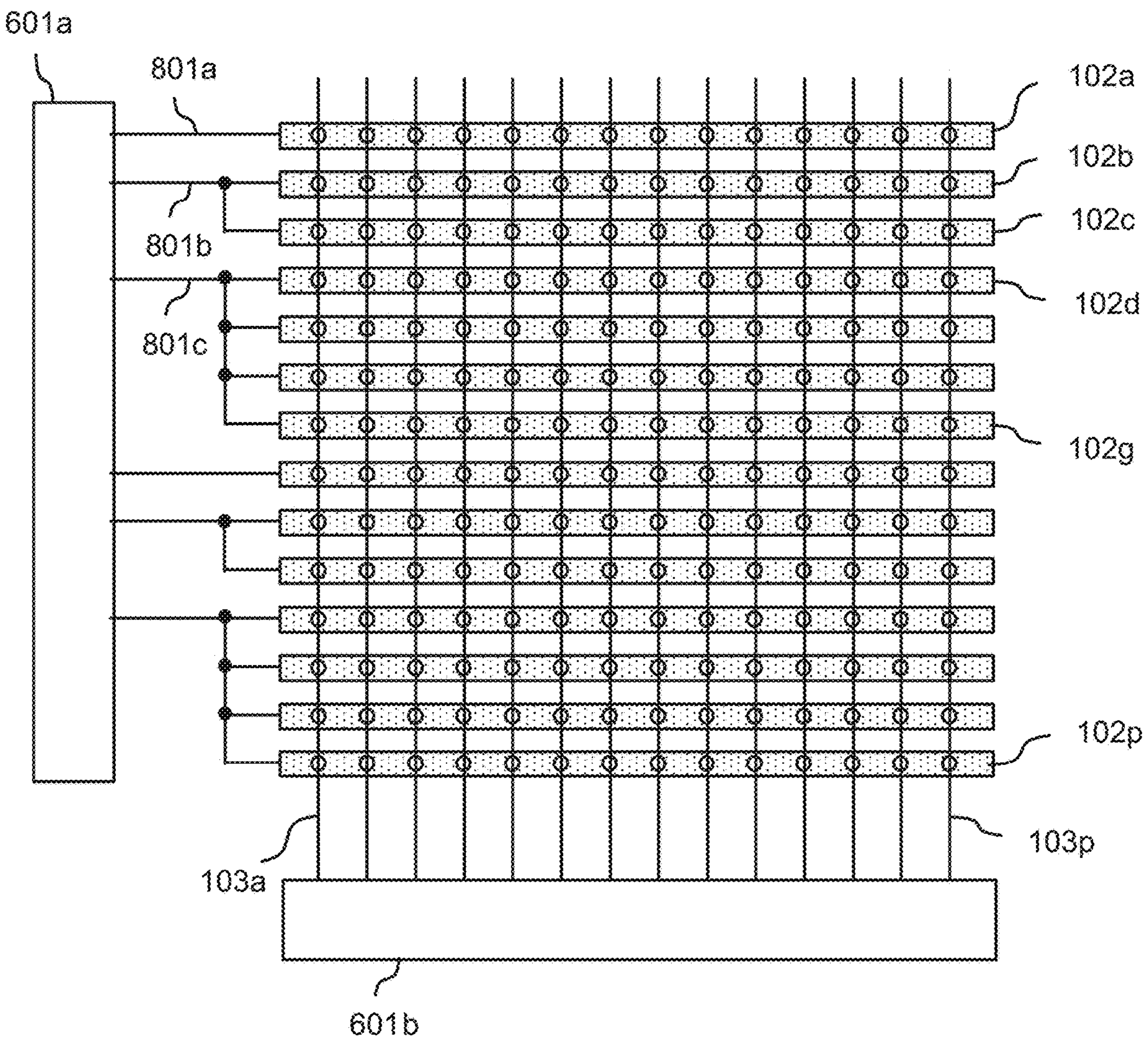
FIG. 9A shows another exemplary embodiment of a top view of a neural network layer and illustrates digital signals are used to perform the function of analog neural networks.

FIG. 9A shows another exemplary embodiment of a top view of a neural network layer and illustrates digital signals are used to perform the function of analog neural networks. The network layer comprises input neuron circuit 601*a* and output neuron circuit 601*b*. The network layer also comprises drain select gates 102*a* to 102*p* and bit lines 103*a* to 103*p*. The first input 801*a* is connected to a drain select gate 101*a*. The second input 801*b* is connected to two drain select gates 102*b* and 102*c*. The third select gate 801*c* is connected to four drain select gates 102*d* to 102*g*. By using this configuration, the inputs 801*a* to 801*c* will turn on 1, 2, and 4 cells, respectively, to represent $2^N$ data, where N is 0, 1, and 2. Using this process, the inputs 801*a* to 801*c* can represent 3-bit data to select 0 to 7 cells. A similar approach can be used to connect the inputs to implement any number of bits.

During back-propagation, the $2^N$ cells selected by the inputs will be programmed together to adjust their Vt (weights). For example, the input 801*c* will turn on the drain select gates 102*d* to 102*g* to program four selected cells together.

Figure 9B:
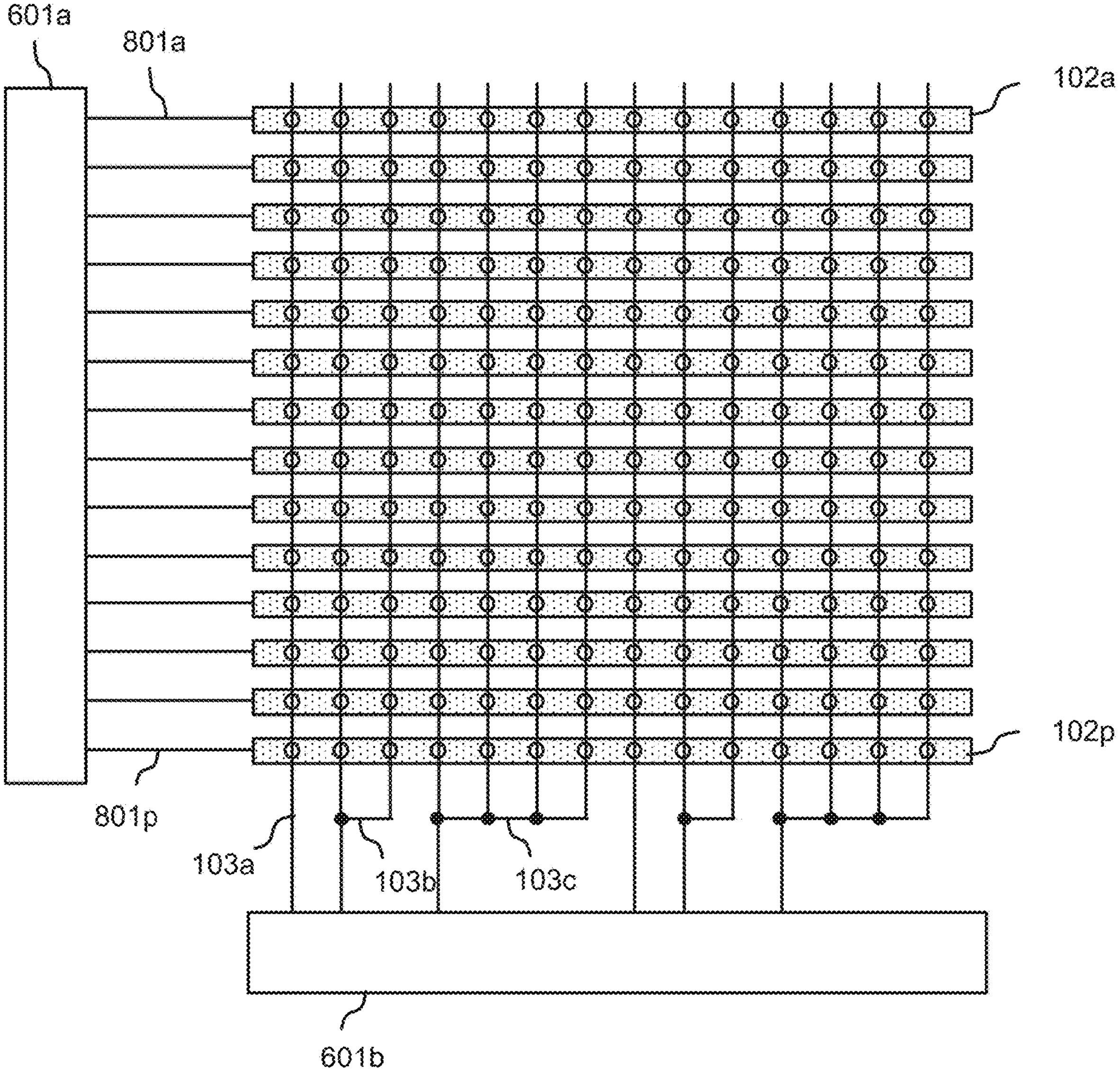
FIG. 9B shows another exemplary embodiment of an array that uses digital signals to perform analog neural network operations.

FIG. 9B shows another exemplary embodiment of an array that uses digital signals to perform analog neural network operations. This embodiment is similar to the embodiment shown in FIG. 9A except that the $2^N$ data is implemented in the bit lines. The outputs 103*a* to 103*c* are connected to 1, 2, and 4 bit lines. In this configuration, the selected input will turn on 1, 2, or 4 cells on the bit lines 103*a* to 103*c*, respectively, to represent $2^N$ data, where N is 0, 1, and 2. In this way, the outputs 103*a* to 103*c* can represent 3-bit data for 0 to 7 cells. A similar approach can be used to set the inputs to obtain outputs with any number of bits.

Figure 10A:
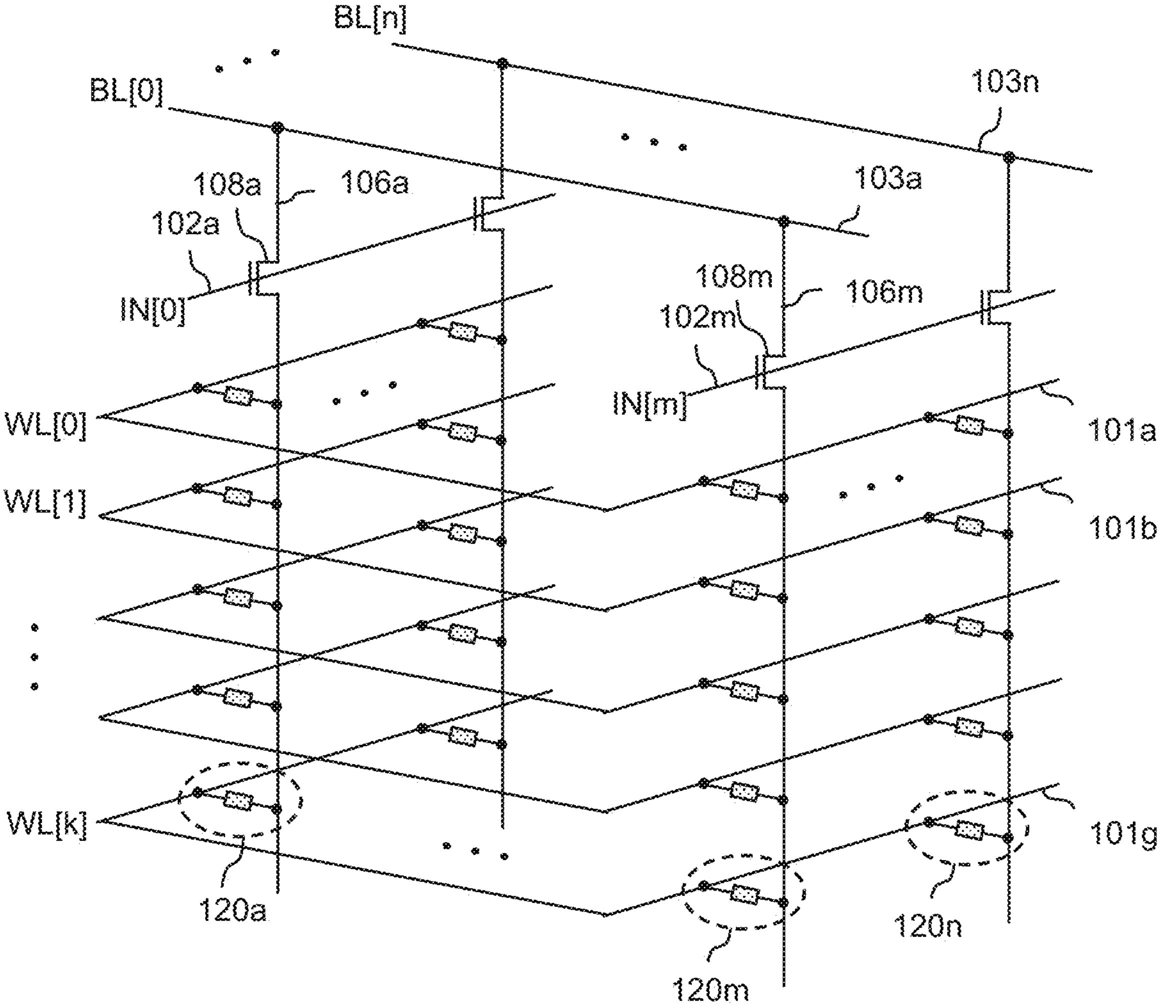
FIG. 10A shows another embodiment of a 3D neural network array constructed with resistive random-access memory (RRAM) technology or phase-change memory (PCM) technology.

FIG. 10A shows another embodiment of a 3D neural network array constructed with resistive random-access memory (RRAM) technology or phase-change memory (PCM) technology. The array architecture is similar to the one shown in FIG. 2B except that the cells 107*a* to 107*n* are replaced by RRAM cells or PCM cells 120*a* to 120*n*.

Figure 10B:
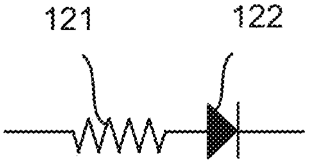
FIG. 10B shows an exemplary basic cell structure of a RRAM or PCM cell for use in the array shown in FIG. 10A.

FIG. 10B shows an exemplary basic cell structure of a RRAM or PCM cell for use in the array shown in FIG. 10A. In one embodiment, the cell contains a resistive memory layer 121 and a selector 122.

For the array shown in FIG. 10A using RRAM, the materials of the word lines 101*a* to 101*g* and bit lines 103*a* to 103*n* are formed of metal, such as titanium (Ti), tantalum (Ta), platinum (Pt), tungsten (W), copper (Cu), chromium (Cr), ruthenium (Ru), aluminum (Al), nickel (Ni), praseodymium (Pr), silver (Ag), Silicon (Si), and many other suitable metals. The resistive memory layer 121 shown in FIG. 10B is formed of metal-oxide, such as HfOx, TiOx, TaOx, AlOx, NiOx, WOx, ZrOx, NbOx, CuOx, CrOx, MnOx, MoOx, SiOx, and many other suitable metal-oxide materials. The selector 122 shown in FIG. 10B comprises a silicon P—N diode, Schottky diode, tunneling dielectric layer, or special metal-oxide layers, such as TiOx, TaOx, NbOx, ZrOx, NbON, VCrOx, and so on.

For the array shown in FIG. 10A using PCM, the resistive memory layer 121 comprises a phase-change material layer and a heater layer. The phase-change material may be chalcogenide, $Ge_2Sb_2Te_5$ (GST), GeTe—$Sb_2Te_3$, $Al_{50}Sb_{50}$, and so on. The heater's material may be titanium-nitride (TiN), polysilicon, and so on. The selector layer 122 uses the same material as used in the RRAM implementation.

Referring again to FIG. 10A, the array comprises multiple word line layers 101*a* to 101*g*, drain select gates 108*a* to 108*m*, and bit lines 103*a* to 103*n*. The drain select gates 108*a* to 108*m* are supplied with the inputs IN[0] to IN[m] 102*a-m* from the outputs of the previous layer. The bit lines 103*a* to 103*n* are connected to the output neuron circuits. The array does not have source select gate 104 and source line 105.

The operation of the embodiment shown in FIG. 10A is similar to the embodiment shown in FIG. 2B, except that the selected on-cell's current flows between the strings 106*a* to 106*m* and the selected word line layer 101*g*, for example. The direction of the on-cell current depends on the direction of the selector 122. A detailed description of the operations is provided with reference to FIG. 2B.

Moreover, similar to the Non-volatile memory cell, the RRAM and PCM cells have digital current (on/off states) to implement digital neural networks, or multiple-level current to implemented analog neural networks.

Figure 11:
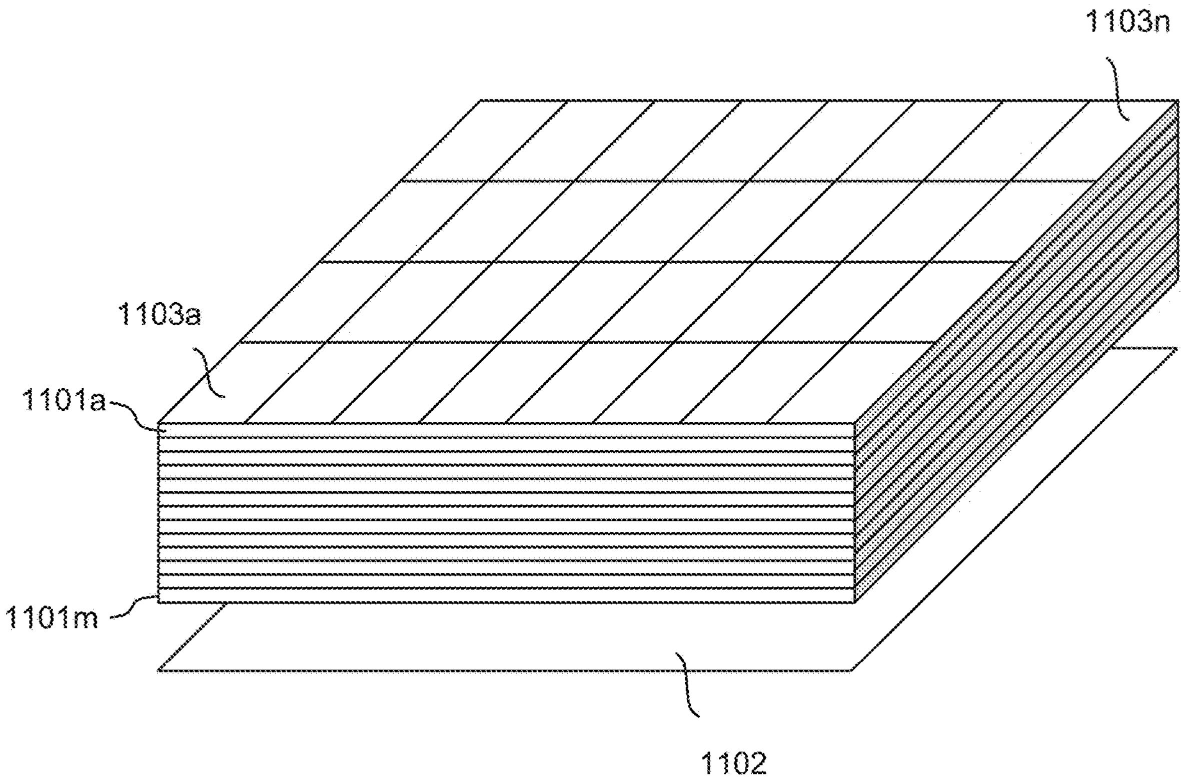
FIG. 11 shows an embodiment of a neural network array constructed using advanced 3D non-volatile memory technology.

FIG. 11 shows an embodiment of a neural network array constructed using advanced 3D non-volatile memory technology. The array comprises 128 word line layers 1101*a* to 1101*m*. Each word line layer comprises 64K drain select gates, 64K bit lines, and 4G cells as synapses. The 128 word line layers contain a total of 512G synapses. By using CUA technology, the array comprises 512K neuron circuits 1102 under the array. The array can be configured into 32 neural networks 1103*a* to 1103*n*. Each neural network contains 16 layers and each layer contains 1K neurons.

In an embodiment in accordance with the invention, the neural network array shown in FIG. 11 can be trained by using a unique operation called 'Direct Learning'. The conventional training for neural networks uses back-propagation to calculate the error between the output and the target for each neuron, and then the weight of each synapse is adjusted based on the error. This requires highly complicated computation and very long training time. In contrast, the direct training directly applies the target to the neuron to adjust the weights of the synapses. This eliminates the computation and significantly reduces the training time.

Figure 12A:
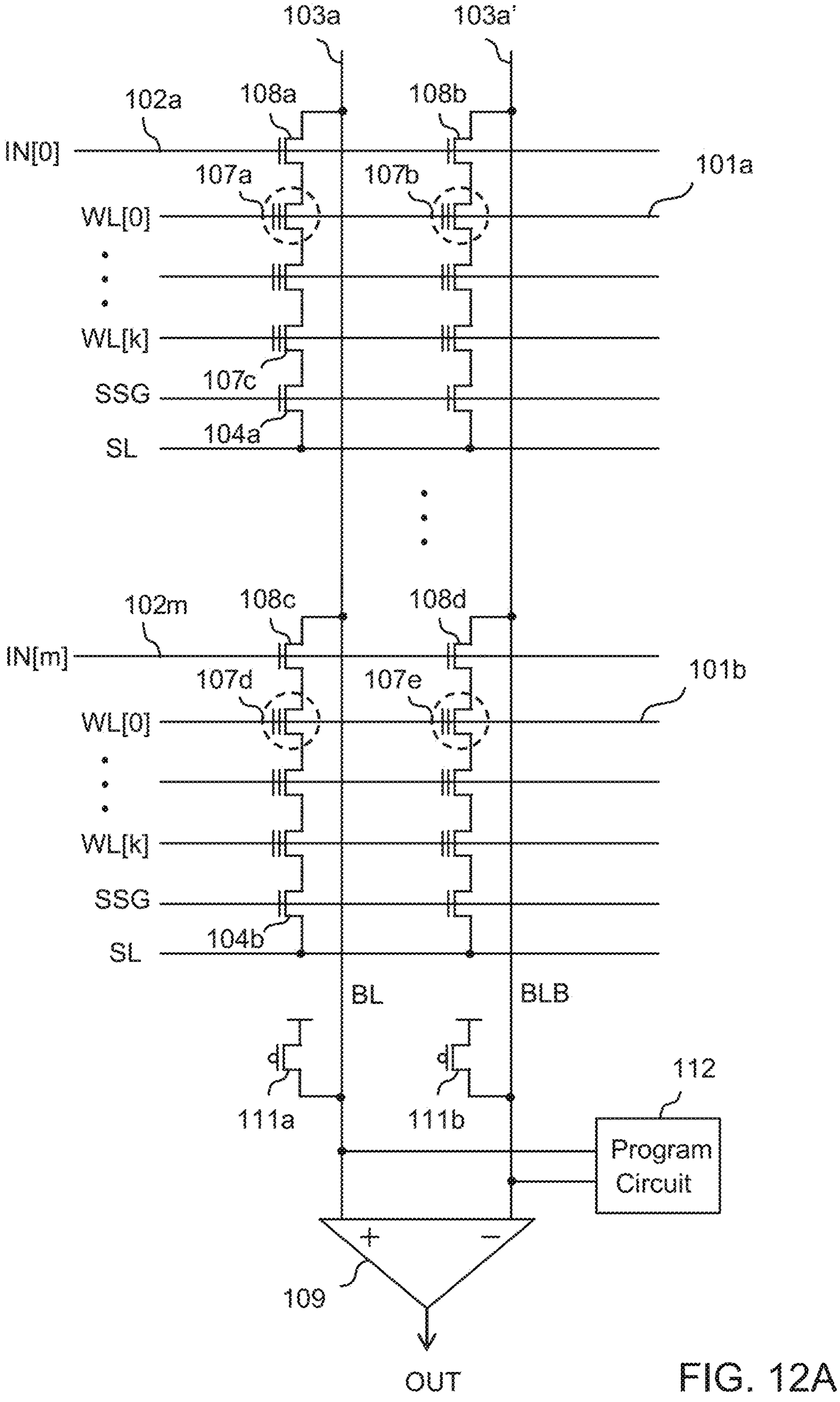
FIG. 12A shows an embodiment of direct training operations performed in accordance with the invention.

FIG. 12A shows an embodiment of direct training operations performed in accordance with the invention. The embodiment uses a double-ended comparator 109 as the neuron circuit. During training, assume the target of the output terminal (OUT) is 1 (VDD) or a high analog voltage. The program circuit 112 applies 0V and VDD to BL 103*a* and BLB 103*a*', respectively. The source select gate (SSG) signal is supplied with 0V to turn off the source select gates 104*a* and 104*b*. The selected word lines 101*a* and 101*b* are supplied with a program high voltage, such as 20V. The unselected word lines are supplied with an inhibit voltage, such as 10V.

Assuming the input IN[0] is 1 (VDD) or a high analog voltage, the drain select gates 108*a* and 108*b* will be turned on. That will pass 0V from BL 103*a* to the channel of the cell 107*a*. The cell 107*a* will be program by the high electric filed between the word line 101*a* and the channel to increase the cell's Vt. Meanwhile, because BLB 103*a*' is VDD, the drain select gate 108*b* is turned off and the channel of the cell 107*b* will be boosted to about 8V by the word line 101*a*. This reduces the electric field between the word line 101*a* and the channel of the cell 107*b*, thus the cell 107*b* is inhibited from programming.

As a result, the Vt of the cell 107*a* is increased. That will reduce the pull-down current of the cell 107*a* during forward propagation. Thus, the output (OUT) will become higher.

On the contrary, if the target of the output is 0 (0V) or a low analog voltage, the program circuit 112 will apply VDD to BL 103*a* and 0V to BLB 103*a*'. This will cause the cell 107*b* to be programmed to increase its Vt, while the cell 107*a* will be inhibited from programming. Therefore, during forward propagation, the pull-down current of the cell 107*b* will be reduced and the output (OUT) will become lower.

Please notice, the program operation will be applied to the cells selected by high inputs. If the input is 0 (0V) or an analog voltage lower than Vt of the drain select gates 108*a* to 108*d*, the drain select gates will be turned off and the cells will be inhibited from programming. That means those cells having high inputs to contribute higher error will be adjusted. This matches the concept of the steepest descent algorithm of the conventional back-propagation.

Please notice, the program high voltage applied to the selected word line may be a short pulse such as 10 us to 20 us. This will adjust small amount of the cell's Vt to prevent over-adjustment. The program pulses may be repeated many times. After each program pulse, a forward propagation may be applied to check the training result. The details about this operation will be described later with reference to FIG. 14A.

Figure 12B:
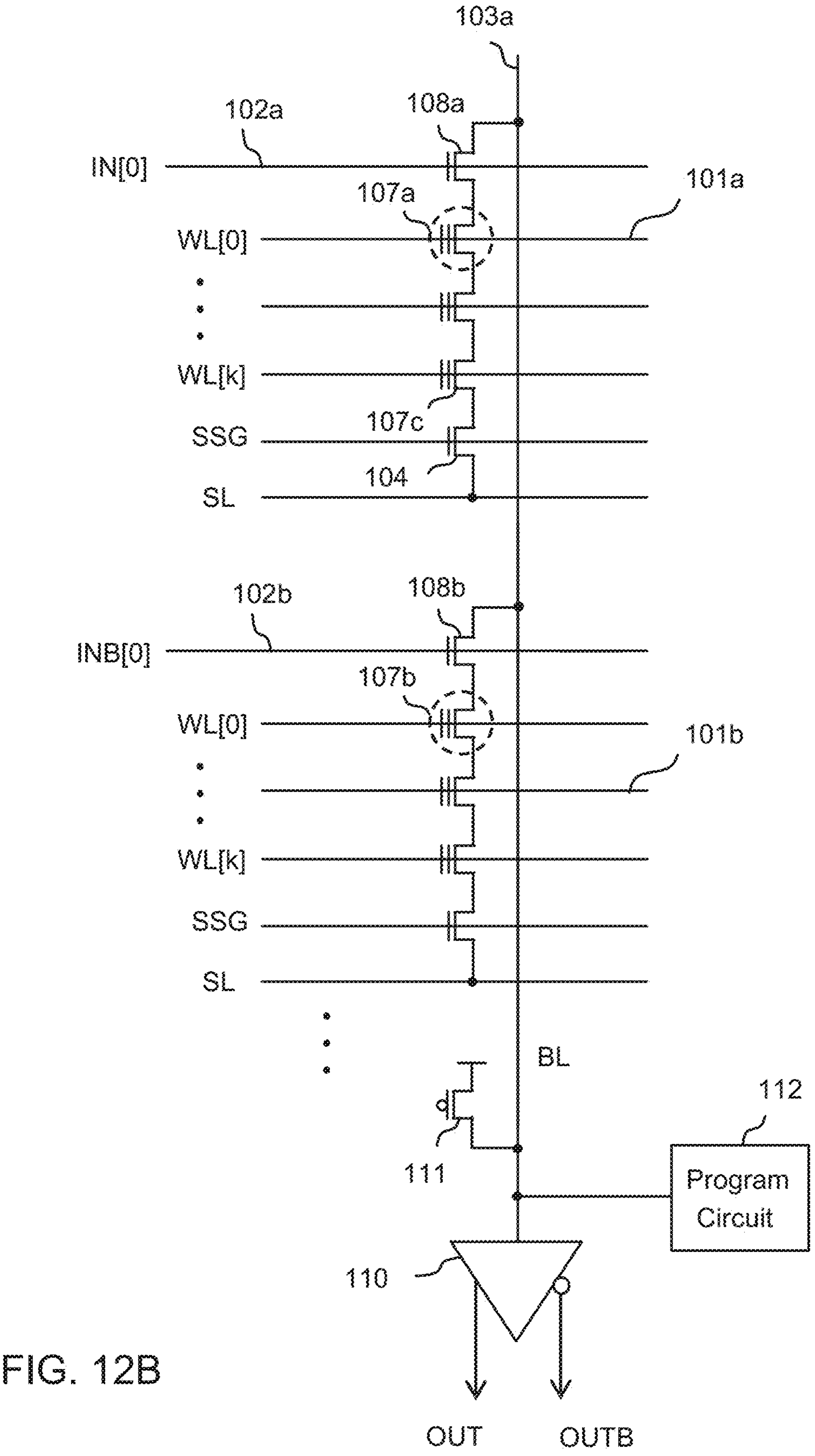
FIG. 12B shows another embodiment of direct training according to the invention.

FIG. 12B shows another embodiment of direct learning according to the invention. The embodiment uses a single-ended comparator 110 as the neuron circuit. Assume the input (IN[0]) is 1 (VDD) or a high analog voltage. Its complementary input (INB[0]) will be 0 (0V) or a low analog voltage. Assume the target of the output (OUT) is 1 (VDD) or a high analog voltage. The program circuit 112 will apply 0V to BL 103*a*. This will program the cell 107*a* to increase the cell's Vt, thus the output (OUT) will become higher during forward propagation.

If the target of the output (OUT) is 0 (0V) or low analog voltage, the program circuit 112 will apply VDD to BL 103*a*. This will inhibit the cell 107*a* from programming, thus the cell's pull-down current will not be reduced.

Please notice, although the direct learning operations described with reference to FIGS. 12A-B can successfully adjust the Vt of the cells using the target of the output. The target of the output is only available for the last layer's output neurons. The targets of the previous layers' neurons are not available. To address this issue in accordance with the invention, the array structures shown in FIGS. 13A-B can be used.

Figure 13A:
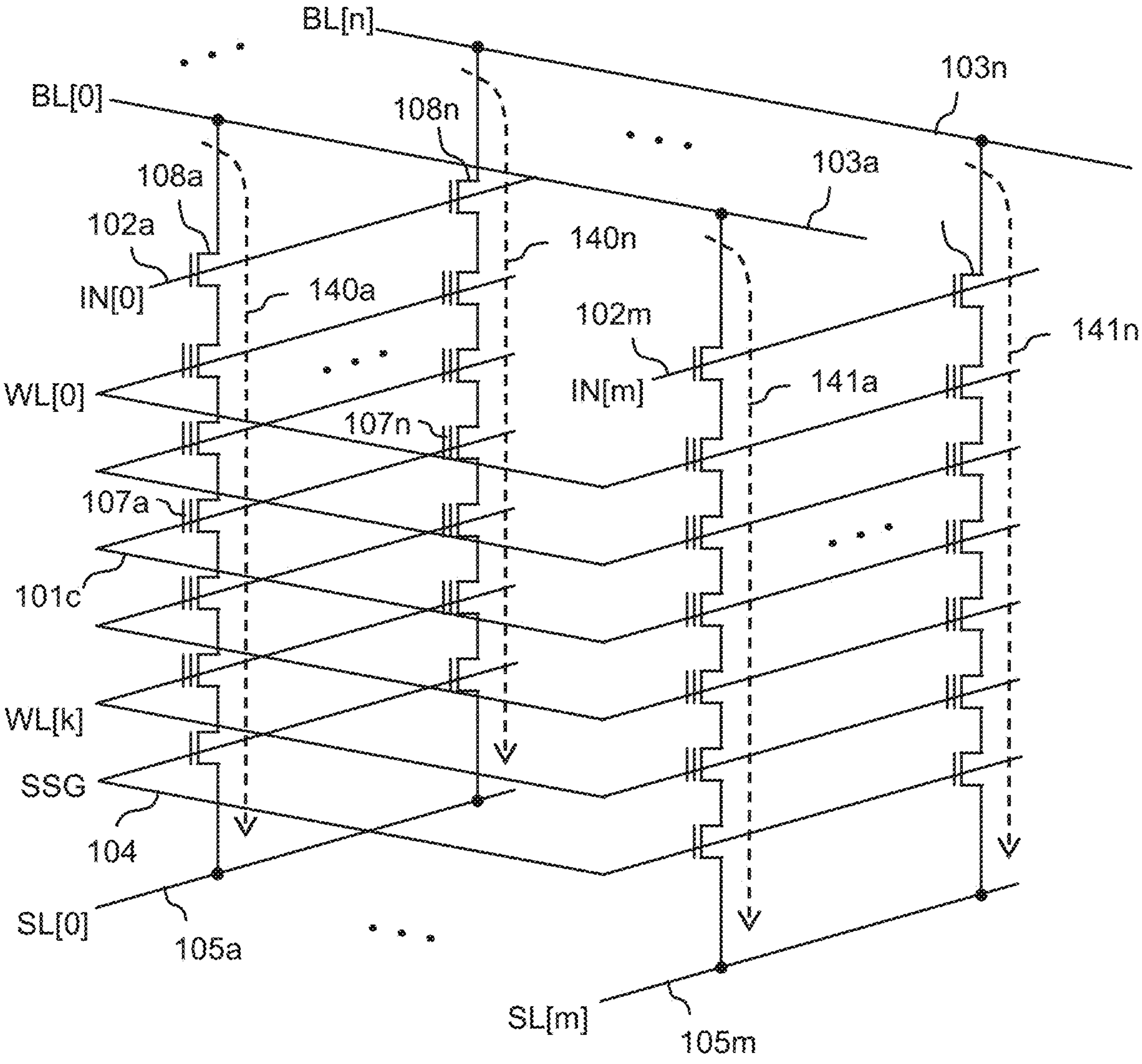
FIG. 13A shows an array structure in accordance with the invention.

FIG. 13A shows an array structure in accordance with the invention. The array's source line is separated into SL[0] to SL[m], as shown by 105*a* to 105*m*. The source lines 105*a* to

105*m* run in the same direction as the input signals IN[0] to IN[m] 102*a* to 102*m*. During back-propagation, the word lines are supplied with the same read conditions as during forward propagation. The selected word line such as 101*c* is supplied with a read voltage. The unselected word lines are supplied with a pass voltage to turn on the unselected cells. The source select gate 104 is supplied with VDD to turn on the source select gates.

The target voltage are applied to the BL[0] to BL[n] by the program circuit 112 shown in FIGS. 12A-B. As shown in FIGS. 12A-B, the bit line data is the opposite of the target. When the target of the output is 1 (VDD) or 0 (0V), the bit line voltage is 0V or VDD, respectively.

Referring again to FIG. 13A, when the bit line voltages are applied to BL[0] to BL[n], current will flow from BL[0] to BL[n] through the selected cells, such as 107*a* to 107*n* and then to the source lines SL[0] 105*a*, as shown by dashed lines 140*a* and 140*n*. The voltage of SL[0] 105*a* will be used as the target or used to generate the target for IN[0] 102*a*.

For example, if the target of BL[0] is 0, BL[0] will be supplied with VDD, which will be passed to SL[0] to pull high SL[0]. Therefore, the target of IN[0] becomes higher. This will cause the cell 107*a* to conduct higher pull down current during forward propagation, thus the output will become lower. In contrast, if the target of BL[0] is 1, BL[0] will be supplied with 0V, which will be passed to SL[0] to pull low SL[0]. Therefore, the target of IN[0] becomes lower. This will cause the cell 107*a* to conduct lower pull down current during forward propagation, thus the output will become higher.

The voltage of SL[0] is determined by the voltages of BL[0] to BL[n], and IN[0], and conductivity of the cells 107*a* to 107*n*. Referring to the neural network architecture shown in FIG. 1B, this is similar to the target of the input 11*a* being determined by the outputs 12*a* to 12*d* and the synapses between the input 11*a* and outputs 12*a* to 12*b*. IN[0] represent the input 11*a*, BL[0] to BL[n] represent the outputs 12*a* to 12*d*, and cells 107*a* to 107*n* represent the synapses. Therefore, the array structure shown in FIG. 13A can perform the functions of a neural network layer, as shown in FIGS. 1B-C.

In FIG. 13A, the voltages of BL[0] to BL[n] will be also passed to other source lines, such as SL[m] 105*m*, as shown by dashed lines 141*a* to 141*n*. As a result, the target for all the inputs, IN[0] to IN[m], are determined by using this configuration. Because the inputs of this layer are the outputs of the previous layer, the same approach can be applied to each layer to find the target of the previous layer. Then, the targets of each layer can be applied to program the cells to adjust the weights using the operations described with reference to FIGS. 12A-B.

Figure 13B:
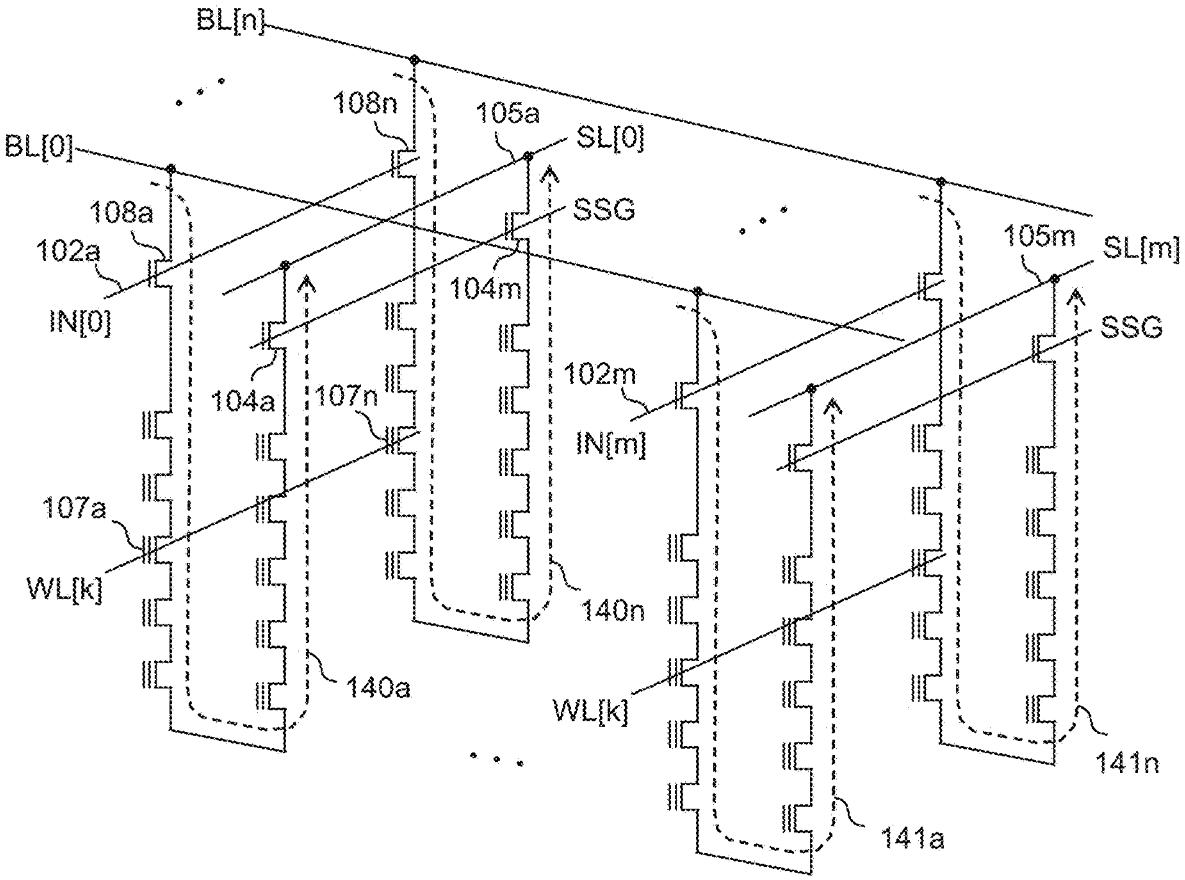
FIG. 13B shows another embodiment of an array suitable for direct training according to the invention.

FIG. 13B shows another embodiment of an array suitable for direct learning according to the invention. In this array structure, cell strings are folded, thus the source lines SL[0] to SL[m] are located on top of the array, as shown at 105*a* to 105*m*. The operation of this array is similar to the one shown in FIG. 13A. For simplicity, the detailed operation will not be repeated, however, a detailed description of operation is provided with reference to FIG. 13A.

Figure 14A:
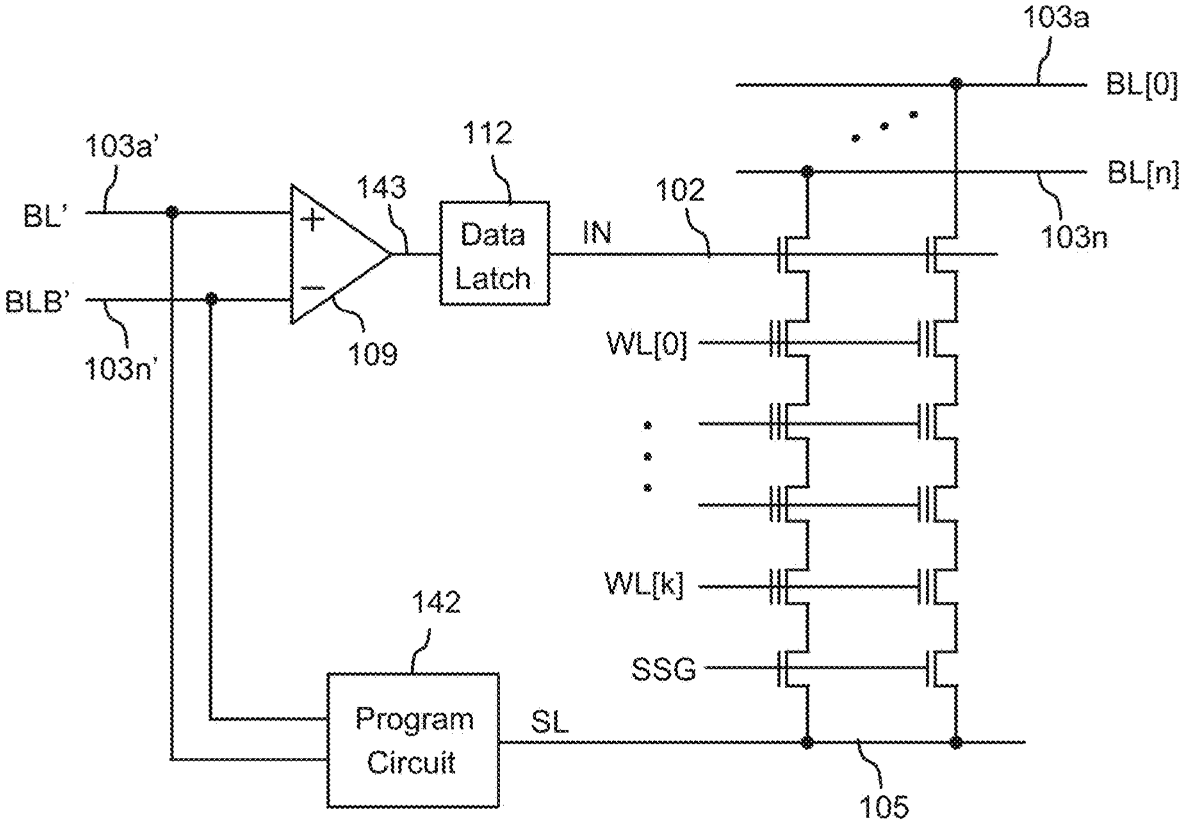
FIG. 14A shows an embodiment of a basic circuit for the input 102 and the source line 105.

FIG. 14A shows an embodiment of a basic circuit for the input 102 and the source line 105. During forward propagation, the previous layer's output is stored in the data latch 112. The data latch 112 will send the data to the input 102. The program circuit 142 will apply 0V to the source line 105. The selected word line and unselected word lines are supplied with the read voltage and pass voltage, respectively. SSG is supplied with VDD to turn on the source select gates. This will generate BL[0] to BL[n] for the next layer.

During back-propagation, the program circuit 142 will float the source line 105. The bias conditions for the word lines, SSG, and IN remain the same as forward propagation. BL[0] to BL[n] are supplied with target voltages. This will cause current flowing through the strings to the source line 105. The program circuit 142 will use the source line voltage to generate the target voltages for BL' 103*a*' and BLB' 103*n*' of the previous layer.

Figure 14B:
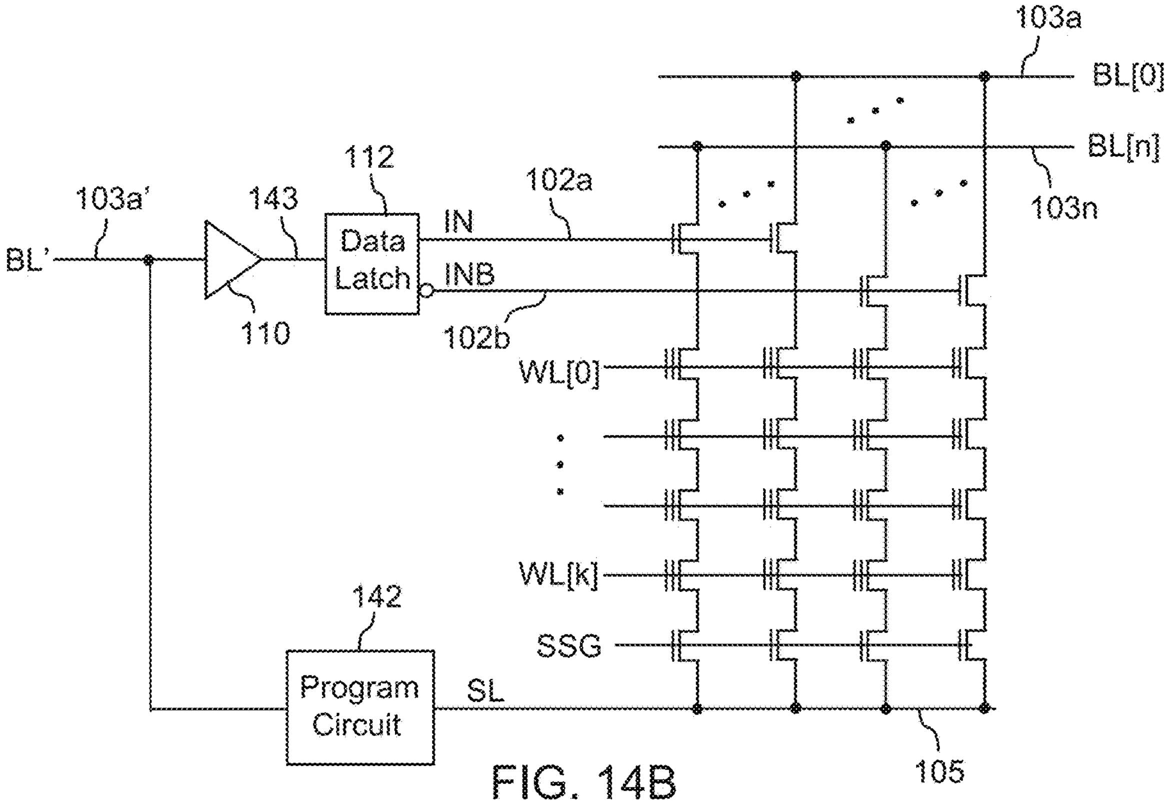
FIG. 14B shows another embodiment of a basic circuit using a single-ended comparator 110.

FIG. 14B shows another embodiment of a basic circuit using a single-ended comparator 110. During forward propagation, the complementary outputs of the lath 112, IN and INB, are applied to the drain select gates 102*a* and 102*b*. The source line 105 is supplied with 0V or VDD from the program circuit 142. Therefore, current may flow from the bit lines 103*a* to 103*n* to the source line 105 or from the source line 105 to the bit lines 103*a* to 103*n* through the selected cells.

During back-propagation, the targets are applied to the bit lines 103*a* to 103*n* and passed to the source lines 105 through the selected cells. The comparator 110 is disabled. The pervious inputs data is stored in the data latch 112 to apply IN and INB to 102*a* and 102*b*, respectively. The voltages of 105 is fed into the program circuit 142 to generate the target for the bit line 103*a*' of the previous layer.

During program operation, for each layer, the data latch 112 will send the input 102 and the program circuit 142 will send the target voltages to BL' and BLB' to program the cells in all the layers together. The training of the neural network shall be done by changing small amount of the weights at one time. Therefore, the program pulse shall not be too long to over-program the cells. An exemplary program pulse may be 1 us to 10 us to only change the cells' Vt for 0.1V, for example.

The above-mentioned procedure from forward propagation, back propagation, to programming the cells is called an 'iteration'. The cells' Vt, which represent the weights of the synapses, are updated during each iteration. After the weights are updated, the next iteration will use the new weights to perform forward propagation to generate the new inputs for each neuron, and perform back-propagation to generate the new target for each neuron, and then update the weights again. This procedure is repeated to gradually change the cells' Vt until the inputs equal to the targets.

The set of inputs and targets are called a 'training sample'. The training process shall be repeated by using large number of training samples. For example, to train the neural network to recognize a hand-written character, tens to hundreds of images of hand-written character may be used as training samples. The training samples may be alternatively applied to the training process for each iteration.

Figure 15A:
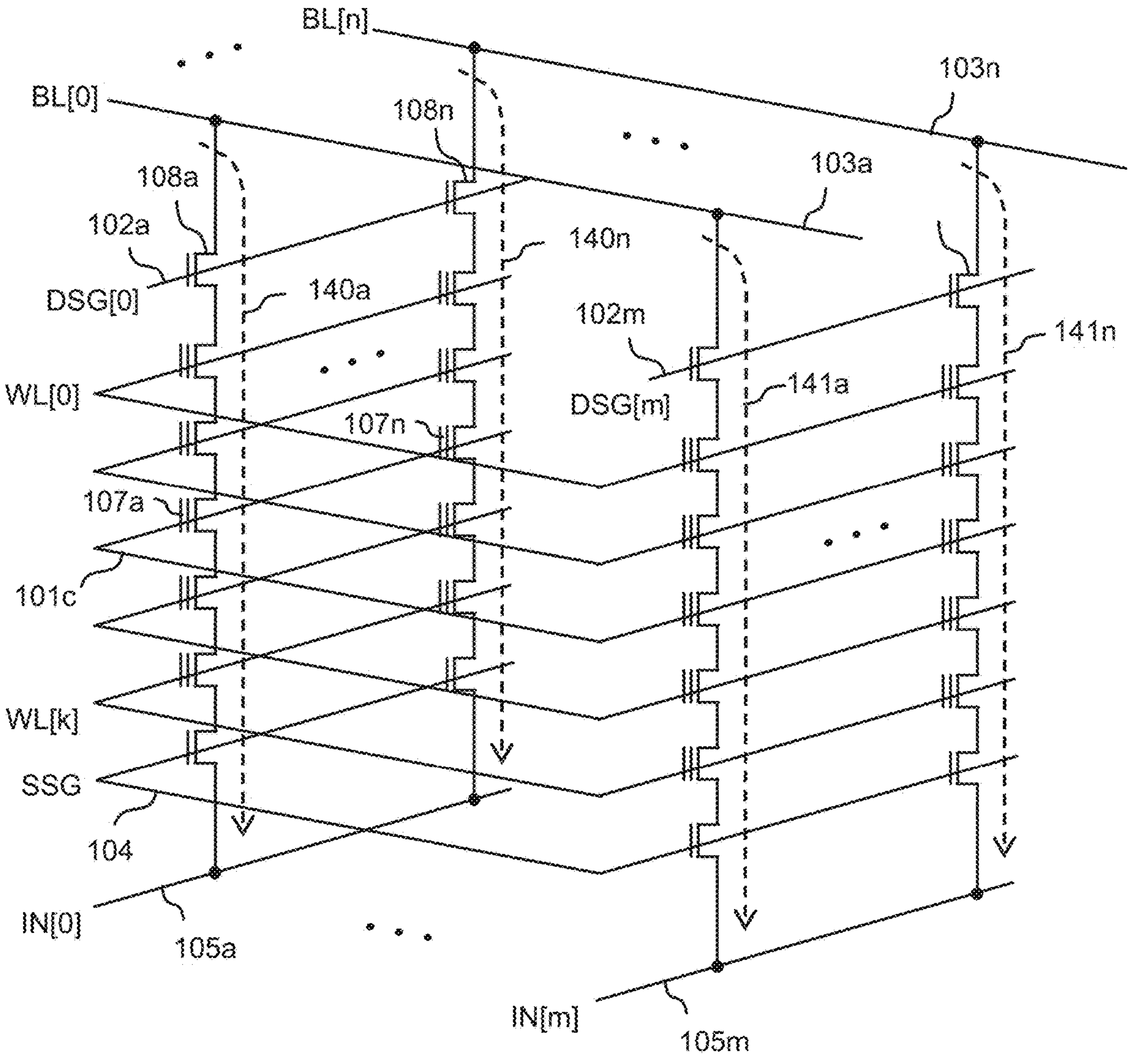
FIG. 15A shows another embodiment of a neural network array structure according to the invention.

FIG. 15A shows another embodiment of a neural network array structure according to the invention. This embodiment is similar to the embodiment shown in FIG. 13A, except that the inputs, IN[0] to IN[m], are applied to the source lines 105*a* to 105*m*. The drain select gates 108*a-m* are connected to the drain select gate (DSG) signals DSG[ ] 102*a* to DSG[m] 102*m*. During the operations, DSG[ ] 102*a* to DSG[m] 102*m*, are supplied with VDD to turn on the drain select gates 108*a* to 108*m* to allow the inputs, IN[0] to IN[m], to pass from the source lines 105*a* to 105*m* through the cells to the bit lines, BL[0] to BL[n]. Similarly, this embodiment may be implemented in the folded array structure shown in FIG. 13B.

Figure 15B:
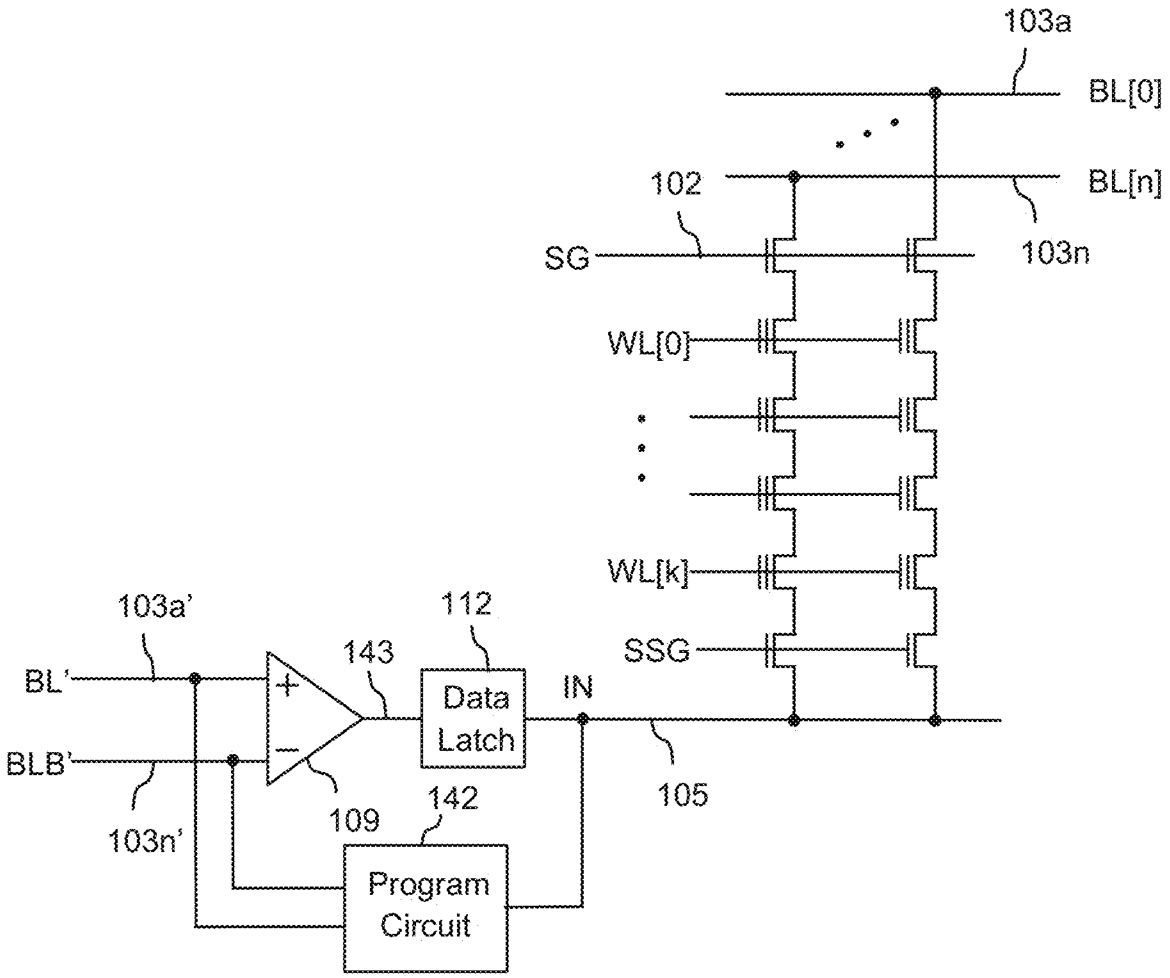
FIG. 15B shows an embodiment of the source line circuit of the array embodiment shown in FIG. 15A.

FIG. 15B shows an embodiment of the source line circuit of the array embodiment shown in FIG. 15A. The operations of the data latch 112 and program circuit 142 are similar to the operations described with reference to FIG. 14A, except that the inputs are applied from source line 105 rather than the drain select gate. The detailed operation will not be repeated but can be found with reference to FIG. 14A.

Figure 15C:
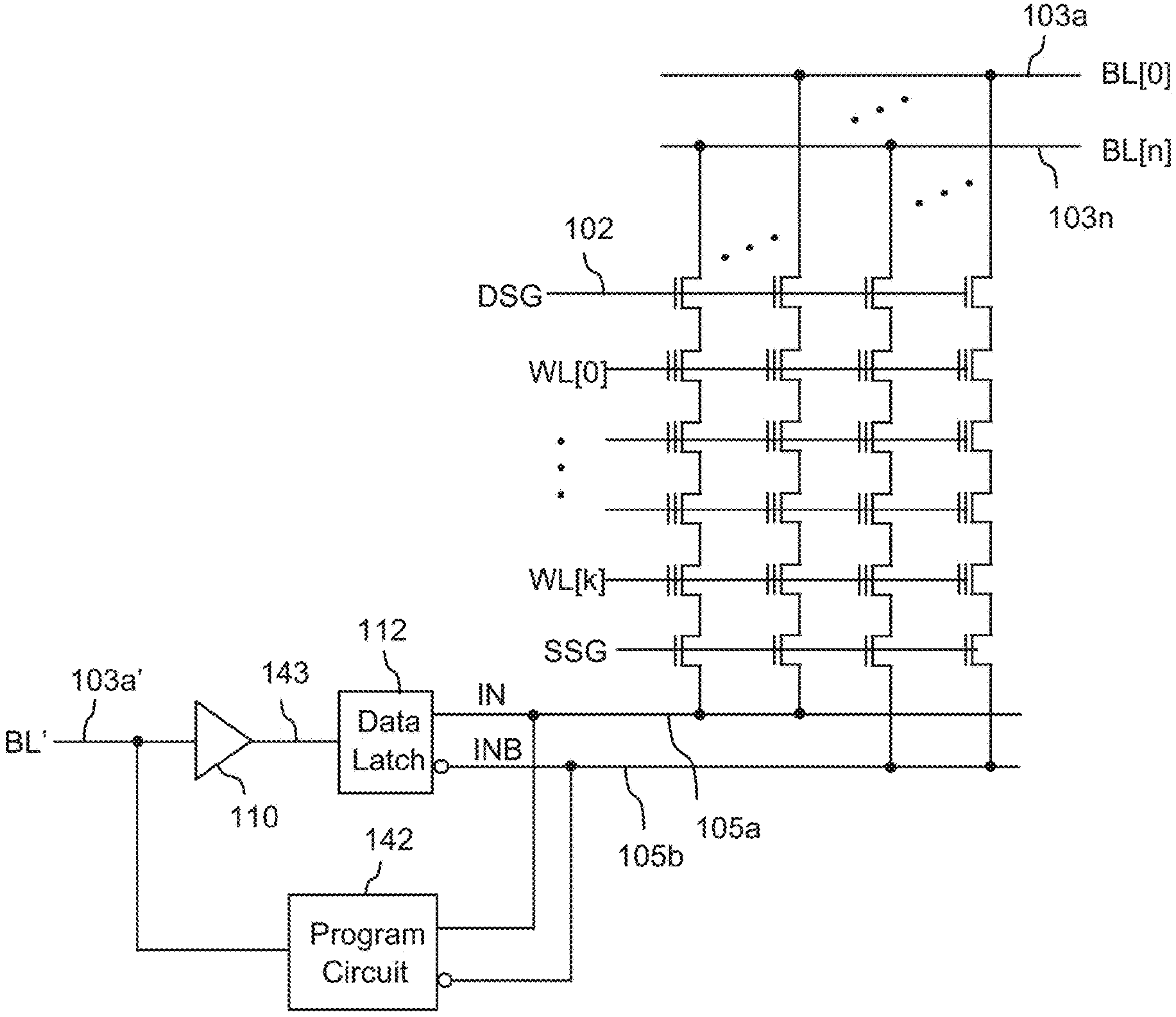
FIG. 15C shows another embodiment of a source line circuit that uses a single-ended comparator.

FIG. 15C shows another embodiment of a source line circuit that uses a single-ended comparator 110. During forward propagation, the complementary inputs, IN and INB, are applied to the source lines 105*a* and 105*b* by the data latch 112, and passed to the bit lines 103*a* to 103*n* through the selected cells. The program circuit 142 is disabled. During back-propagation, the targets are applied to the bit lines 103*a* to 103*n* and passed to the source lines 105*a* to 105*b* through the selected cells. The data latch 112 is disabled. The voltages of 105*a* and 105b are fed into the program circuit 142 to generate the target for the bit line 103*a*' of the previous layer.

Figure 16A:
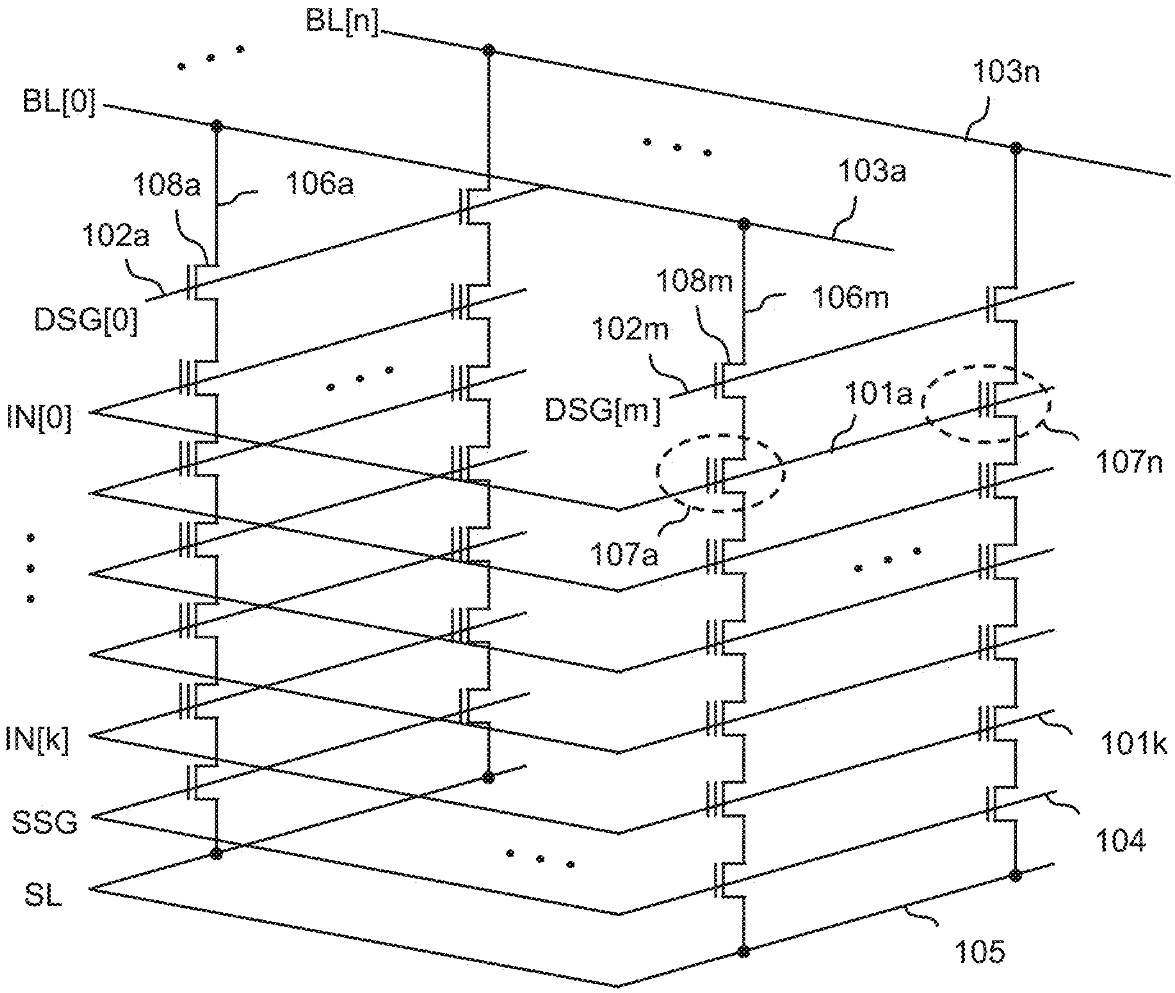
FIG. 16A shows another embodiment of a neural network using non-volatile memory array.

FIG. 16A shows another embodiment of a neural network using a non-volatile memory array. In this embodiment, the inputs, IN[0] to IN[k], are applied to the word line layers 101*a* to 101*k*. During operation, only one word line layer is selected. The selected layer is supplied with the input data or voltage. All the unselected layers are supplied with the pass voltage to turn on the unselected cells. One of the drain select gates, DSG[ ] to DSG[m], 102*a* to 102*m* is selected. The selected and unselected drains select gates are supplied with VDD and 0V, respectively. For example, assuming DSG[m] 102*m* and IN[0] 101*a* are selected, this will select the cells 107*a* to 107*n* to perform one task. When selecting other drain select gates and input layers, other cells will be selected. This allows the array to be configured to select different cells to perform many neural network tasks.

The array shown in FIG. 16A is called a 'block'. The advantage of this array is that it only requires one neuron circuit per block. The neuron circuit can be connected to the selected input layer through a decoder or a select gate. This allows the neuron circuit to be located under the array, as shown in FIG. 6B.

Figure 16B:
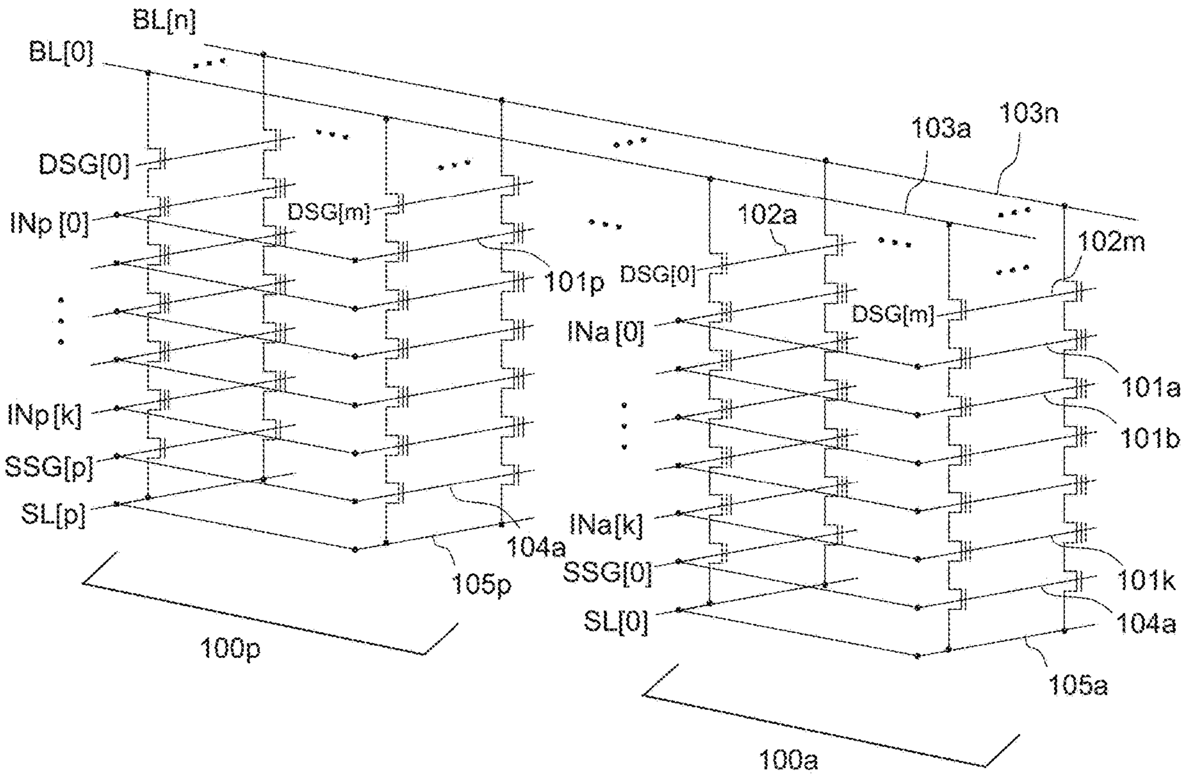
FIG. 16B shows an embodiment of an array structure containing multiple blocks.

FIG. 16B shows an embodiment of an array structure containing multiple blocks 100*a* to 100*p*. In each block, one input layer and one drain select gate are selected. Please notice, in this embodiment, targets can be applied to BL[0] 103*a* to BL[n] 103*n* to pass through the selected drain select gates and selected cells to reach SL[0] 105*a* to S[p] 105*p* to generate the targets for the inputs.

Figure 17:
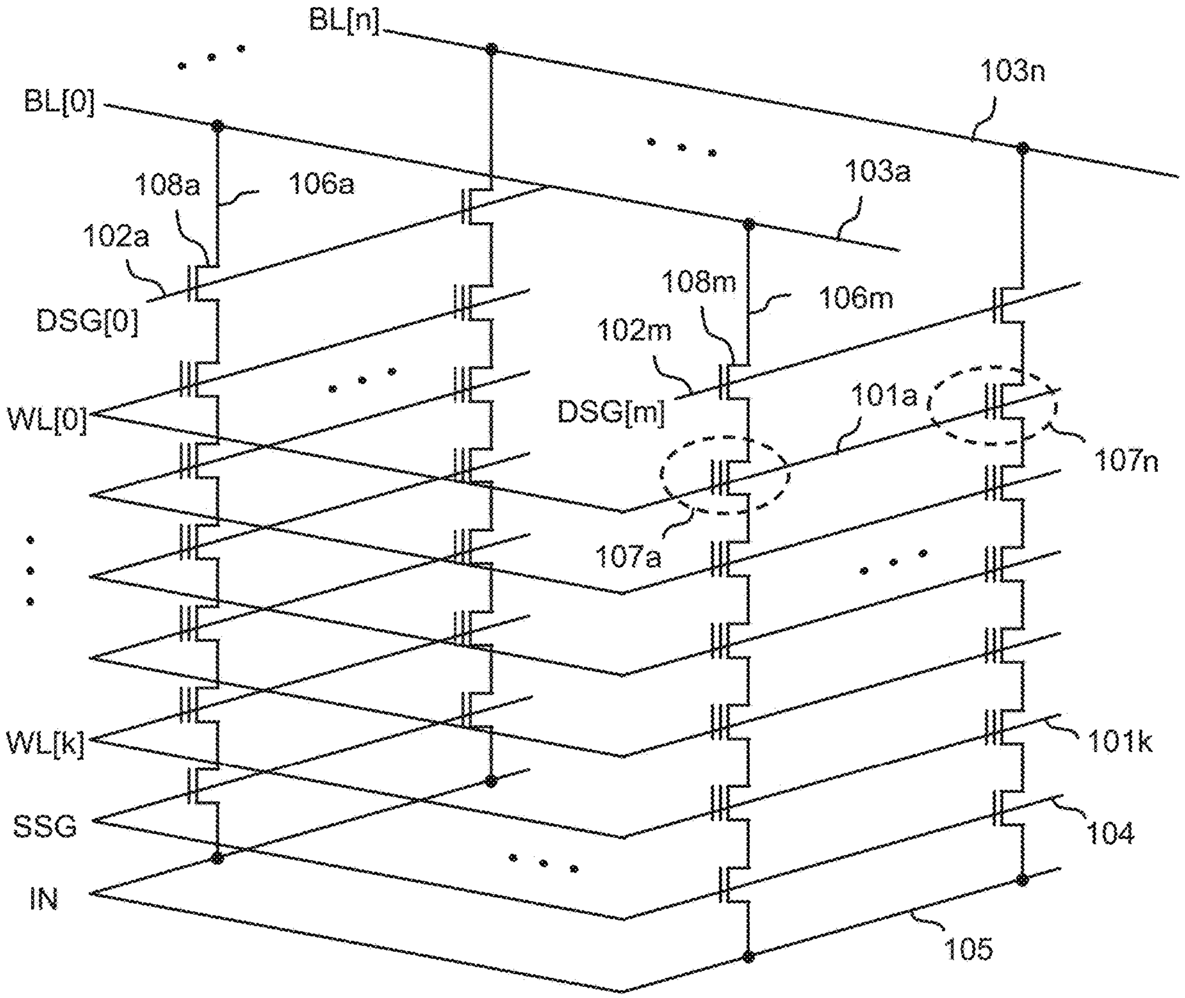
FIG. 17 shows another embodiment of the neural network array structure according to the invention.

FIG. 17 shows another embodiment of the neural network array structure according to the invention. In this embodiment, the input is applied to the source line 105. One of the drain select gate signals DSG[ ] 102*a* to DSG[m] 102*m* is selected and supplied with VDD to turn on the selected drain select gate 108*a* to 108*m*. One of the word lines 101*a* to 101*k* is selected and supplied with the read voltage, such as VR1 shown in FIGS. 3A-C to read the selected cells. The other unselected word lines are supplied with the pass voltage such as VR2 shown in FIGS. 3A-C to turn on the unselected cells. For example, assuming the drain select gate 102*m* and the word line 101*a* are selected, the cells 107*a* to 107*n* will be selected. The input 105 voltage will be passed to the bit lines 103*a* to 103*n* through the cells 107*a* to 107*b*. For example, if the input 105 is VDD, it will pull up the bit lines 103*a* to 103*n*. If the input 105 is 0V, it will pull down the bit lines 103*a* to 103*n*. The pull-up or pull-down current is dependent on the cells' Vt. The lower cell Vt results in higher pull-up or pull-down current. Therefore, the cell's Vt represent a weight function of the synapse.

Figure 18A:
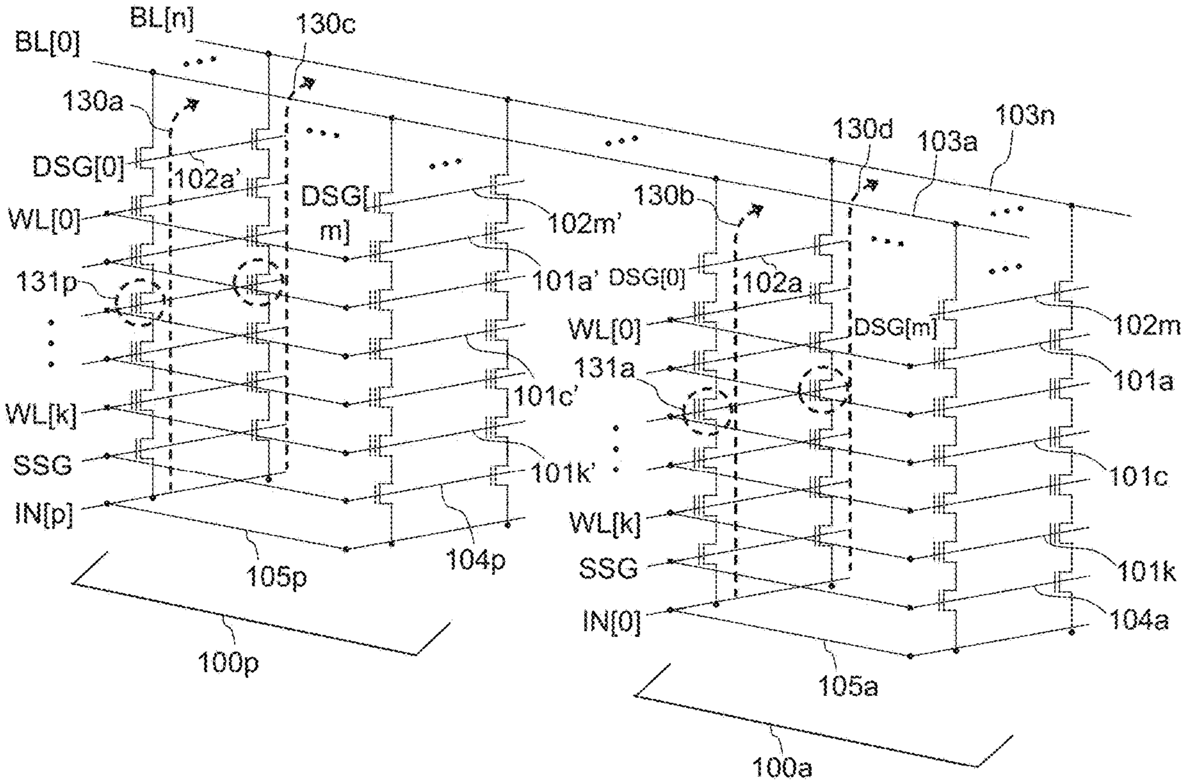
FIG. 18A shows an embodiment of a layer of a neural network array during forward propagation.

FIG. 18A shows an embodiment of a layer of a neural network array during forward propagation. The array comprises multiple array structures 100*a* to 100*p*, as shown in FIG. 17. The source lines 105*a* to 105*p* of the array structures 100*a* to 100*p* are supplied with the inputs, IN[0] to IN[p]. The drain select gate signals 102*a* to 102*m* and 102*a*' to 102*m*' are connected to the same signals DSG[ ] to DSG[m], respectively. The word lines 101*a* to 101*k* and 101*a*' to 101*k*' are connected to the same signals WL[0] to WL[k], respectively.

Assuming that the drain select gate signals 102*a* and 102' and the word lines 107*c* and 107*c*' are selected, the voltage of the inputs 105*a* to 105*p* will pass through the selected cells, such as 131*a* to 131*p* to the bit lines 103*a* to 103*n*, as shown by dashed lines 130*a* to 130*d*.

Figure 18B:
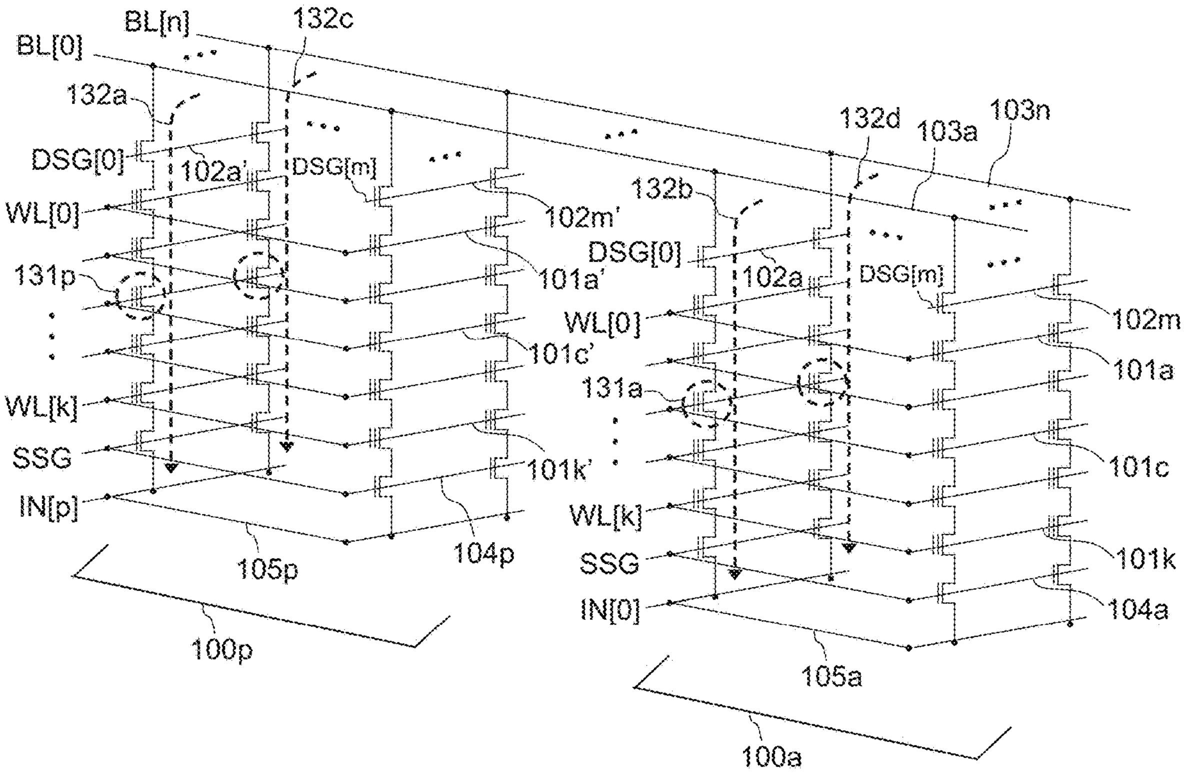
FIG. 18B shows an embodiment of a neural network array during back-propagation operation.

FIG. 18B shows an embodiment of a neural network array during back-propagation operation. The bit lines 103*a* to 103*n* are applied with the target voltages, which will be passed to the inputs 105*a* to 105*p* through the selected cells, such as 131*a* to 131*p*, as shown by dashed lines 132*a* to 132*d*. Then, the target of each input may be determined by using the embodiment shown in FIG. 15A.

Figure 19A:
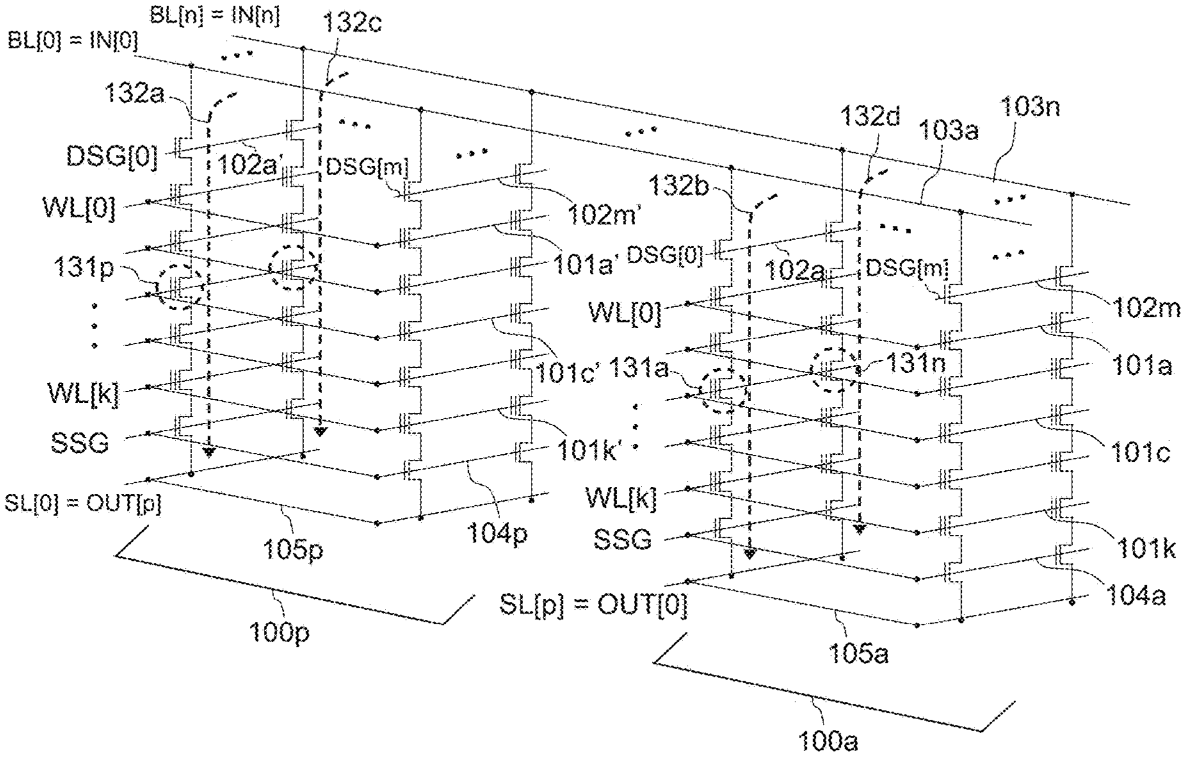
FIG. 19A shows another embodiment of a neural network array according to the invention.

FIG. 19A shows another embodiment of a neural network array according to the invention. In this embodiment, the inputs, IN[0] to IN[n], are applied to the bit lines 103*a* to 103*n*. The drain select gate signals 102*a* to 102*m* and 102*a*' to 102*m*' are connected to the same signals DSG[ ] to DSG[m], respectively. The word lines 101*a* to 101*k* and 101*a*' to 101*k*' are connected to the same signals WL[0] to WL[k], respectively.

For example, in block 100*a*, assuming the drain select gate signal 102*a* is selected, it will be supplied with VDD to turn on the drain select gate to allow currents 132*b* to 132*d* to flow from the bit lines 103*a* to 103*n* to the cell strings. Assuming the word line 101*c* is selected, the word line will be supplied with a read voltage, such as VR1 shown in FIGS. 3A-C, to the selected cells 131*a* to 131*n*. The other unselected word lines are supplied with the pass voltage, such as VR2 shown in FIGS. 3A-C to turn on the unselected cells. The source select gate 104*a* is supplied with VDD to turn on the source select gates to allow the currents 132*b* to 132*d* to flow to the source line 105*a*. The source lines 105*a* to 105*p* are connected to the outputs, OUT[0] to OUT[p].

In this embodiment, during back-propagation, the targets may be applied to the source lines 105*a* to 105*p*. That will pass current through the selected cells 132*b* to 132*d* and 132*a* to 132*c* to the bit lines 103*a* to 103*n* to generate the targets for the inputs.

Figure 19B:
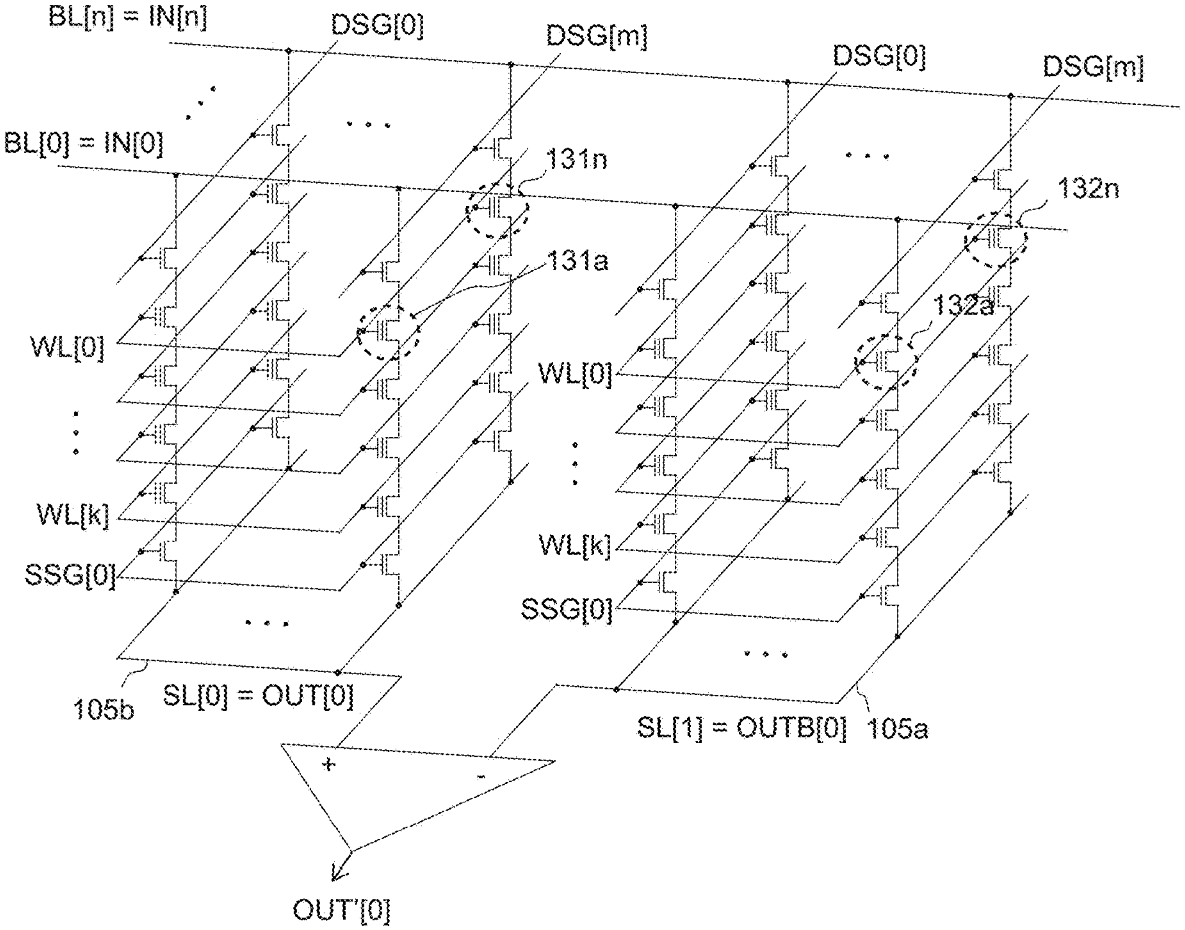
FIG. 19B shows an exemplary embodiment illustrating how the source lines may be connected the complementary inputs of a comparator in the output neuron circuit.

FIG. 19B shows an exemplary embodiment illustrating how the source lines 105*a* to 105*p* shown in FIG. 19A may be connected the complementary inputs, OUT and OUTB, of a comparator in the output neuron circuit. Therefore, the memory cells 131*a* to 131*c* represent the synapses with positive weights, and the memory cells 131*b* to 131*d* represent the synapses with negative weights.

Figure 20:
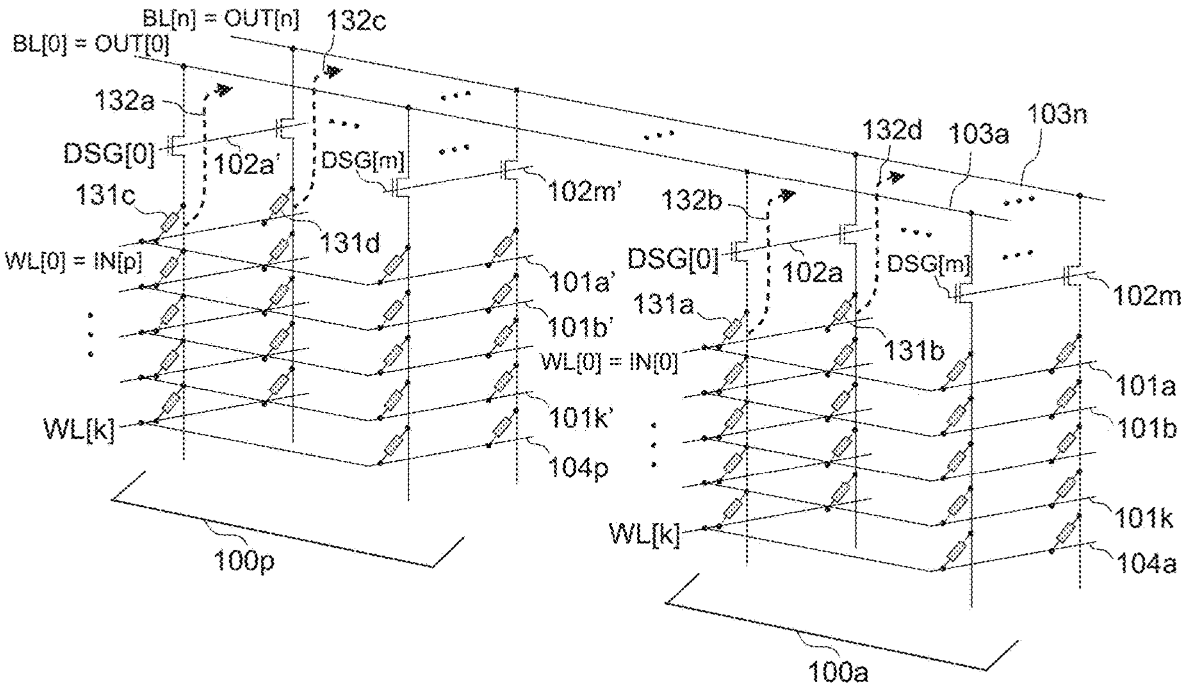
FIG. 20 shows another embodiment of a 3D neural network array according to the invention.

FIG. 20 shows another embodiment of a 3D neural network array according to the invention. In this embodiment, the synapses are implemented by resistive type of memory cells, such as the memory cells used in resistive random-access memory (RRAM) or phase-change memory (PCM).

The drain select gate signals 102*a* to 102*m* and 102*a*' to 102*m*' are connected to the same signals DSG[0] to DSG[m], respectively. During forward propagation, it will be assumed that the drain select gates 102*a* and 102*a*' are selected. The signal DSG[0] are supplied with VDD to turn on the drain select gates. The inputs, IN[0] to IN[p], are applied to the selected word lines 101*a* and 101*a*'. This passes currents from the word lines 101*a* and 101*a*' through the selected cells 131*a*, 131*b*, 131*c*, and 131*d* to the bit lines 103*a* to 103*n*. The bit lines 103*a* to 103*b* are connected to the output neuron circuits, as shown in FIGS. 4A-B.

The unselected word lines, such as 101*b* to 101*k* and 101*b*' to 101*k*' are supplied with a low voltage such as 0V. Because the memory cells 131*a* to 131*d* contain a selector, such as a diode, the voltage will bias the memory cells on the unselected word lines to the 'off' state. Therefore, there is no current flowing between the unselected word lines to the bit lines.

During back-propagation, the targets are applied to the bit lines 103*a* to 103*n*. That will pass current through the selected cells 131*a* to 131*d* to the word lines 101*a* and 101*a*' to generate the targets for the inputs. Similarly, the unselected word lines 101*b* to 101*k* and 101*b*' to 101*k*' are supplied with an unselected voltage to turn off the memory cells on the unselected word lines.

Figure 21A:
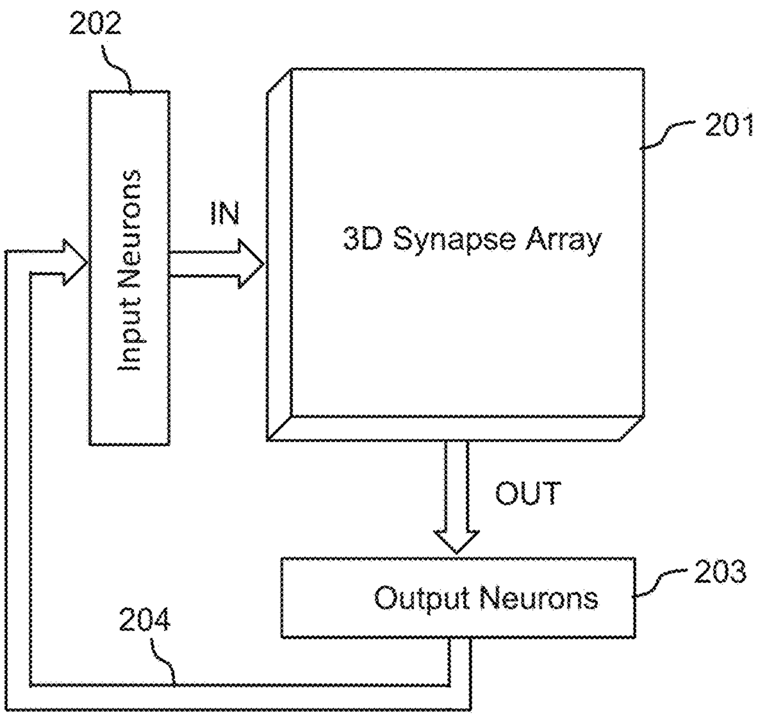
FIG. 21A shows another embodiment of a neural network architecture according to the invention.

FIG. 21A shows another embodiment of a neural network architecture according to the invention. Different from the multiple-layer neural network architecture shown in FIGS. 7A-C, in this embodiment, the architecture may use only one synapse array 201. The synapse array is implemented using the 3D arrays shown in the previous embodiments from FIG. 13A to FIG. 20.

The array shown in FIG. 21A also comprises the input neuron circuit 202 and the output neuron circuit 203. During forward propagation, for example at time T1, the input neuron circuit 202 feeds the inputs of the first layer to the synapse array 201 and selects the synapses of the first layer to generate the outputs of the first layer by the output neuron circuit 203. The outputs may be feedback to the input neuron circuit 202, as shown at 204 to become the inputs of the second layer.

At time T2, the input neuron circuit 202 feeds the inputs of the second layer to the synapse array 201 and selects the synapses of the second layer to generate the outputs of the second layer from the output neuron circuit 203. The outputs are fed back to the input neuron circuit 202, as shown 204, to become the inputs of the third layer. This procedure may be repeated until all the desired number of layers are processed. By using this procedure, the neural network may contain any number of layers. This provides high flexibility for building the neural network architecture.

In the procedure described in the previous paragraph, the number of inputs and outputs of each layer may be different. This can be done by selecting different number of inputs and outputs in the input neuron circuit 202 and output neuron circuit 203 for each layer's operation. For example, assuming the input neuron circuit 202 and output neuron circuit 203 have 1,000 neurons each, when processing the operation for each layer, the neuron number may be selected from 1 to 1,000. By using this process, the number of neurons in each layer may be flexibly designed. As a result, a highly-flexible multi-layer neural network architecture is realized.

Figure 21B:
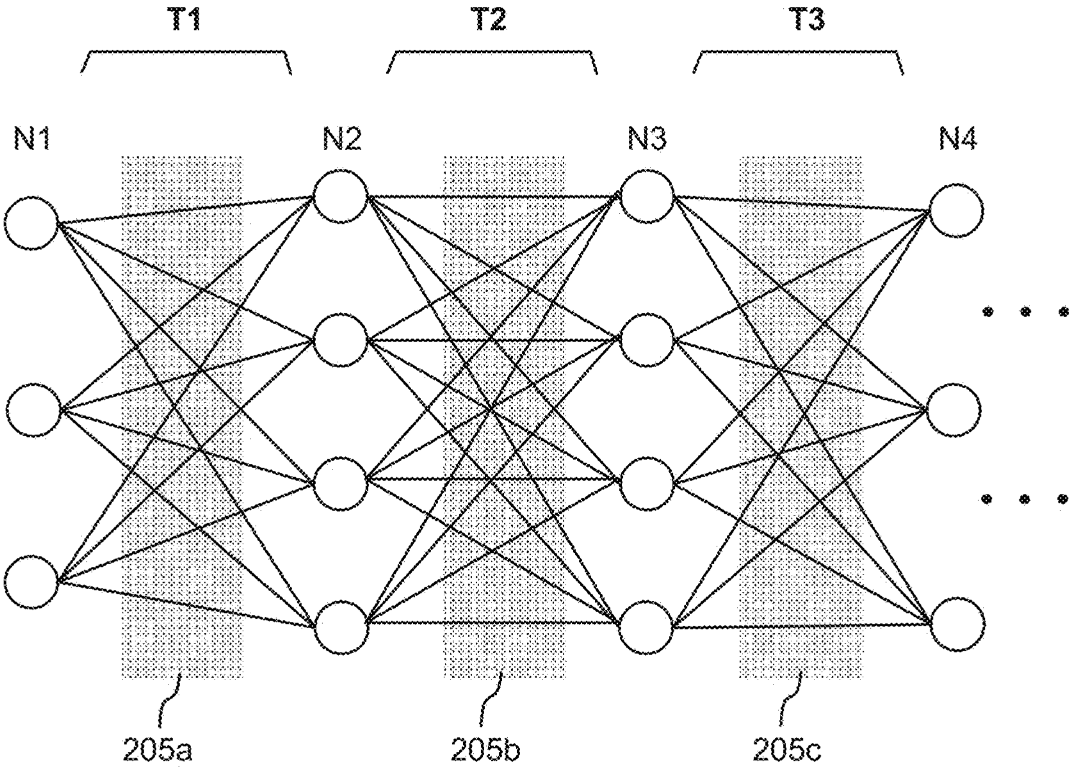
FIG. 21B illustrates how the circuit shown in FIG. 21A can be used to simulate the multiple-layer neural network architecture shown in FIG. 21B.

FIG. 21B illustrates how the circuit shown in FIG. 21A can be used to simulate the multiple-layer neural network architecture shown in FIG. 21B. It will be assumed that the neural network has N1, N2, N3, and N4 number of neurons in the first to fourth neuron layers, respectively. At time T1, the input neuron circuit 202 will feed N1 number of inputs to the synapse array and select the first layer's synapses 205*a* to generate N2 number of outputs. The N2 number of outputs are fed back to the input neuron circuit 202 to become the inputs of the second layer.

At T2 time, the input neuron circuit 202 may feed the N2 number of inputs to the synapse array and select the second layer's synapses 205*b* to generate N3 number of outputs. The N3 number of outputs are fed back to the input neuron circuit 202 to become the inputs of the third layer.

At T3 time, the input neuron circuit 202 feeds the N3 number of inputs to the synapse array and select the third layer's synapses 205*c* to generate N4 number of outputs. The N4 number of outputs are fed back to the input neuron circuit 202 to become the inputs of the four layer. This procedure may be repeated until all the layers are processed. By using this procedure, the neural network architecture shown in FIG. 21B is realized.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. A neural network array comprising:

a plurality of vertical strings in a three-dimensional (3D) non-volatile memory array, each vertical string having a drain select gate transistor connected to a plurality of non-volatile memory cells that are connected in series along a vertical channel, and wherein each non-volatile memory cell functions as a synapse and represents a synaptic weight based on a threshold voltage (Vt) or resistance of the non-volatile memory cell;

a plurality of output nodes, each output node connected to receive output signals from a plurality of drain terminals of the drain select gates;

a plurality of input nodes, each input node connected to provide input signals to a plurality of gate terminals of the drain select gates;

a plurality of weight select signals connected to the plurality of memory cells in each string, respectively, and wherein each weight select signal provides a selected voltage to a selected non-volatile memory cell to cause the selected non-volatile memory cell to conduct current according to a selected characteristic of the selected non-volatile memory cell; and circuitry configured to perform direct in-array training by applying target voltages to the output nodes and propagating the target voltages through selected non-volatile memory cells to adjust the selected characteristic of the selected non-volatile memory cells.

2. The neural network array of claim 1, wherein the selected characteristic is a voltage threshold (Vt) of the selected non-volatile memory cell.

3. The neural network array of claim 1, wherein the output nodes are connected to positive and negative inputs of a comparator circuit to implement positive and negative synapse weights.

4. The neural network array of claim 1, wherein the input nodes receive the input signals and complementary input signals to implement positive and negative synapse weights.

5. The neural network array of claim 1, wherein each non-volatile memory cell is a 3D resistive memory cell.

6. The neural network array of claim 5, wherein the selected characteristic is a resistance value of the selected non-volatile memory cell.

7. The neural network array of claim 5, wherein each 3D resistive memory cell comprises a resistive random-access memory (RRAM) device.

8. The neural network array of claim 5, wherein each 3D resistive memory cell comprises a phase change memory (PCM) devices.

9. The neural network array of claim 5, wherein each 3D resistive memory cell comprises a threshold device.

10. The neural network array of claim 9, wherein the threshold device comprises a diode.

11. The neural network array of claim 1, wherein the neural network array is configured as a three-dimensional (3D) memory array.

12. The neural network array of claim 1, wherein a plurality of the neural network arrays are connected together to form a multiple-layer neural network, and wherein output nodes of one neural network layer are connected to input nodes of another neural network layer.

13. The neural network array of claim 12, wherein output nodes of a last neural network layer are connected in a feedback configuration to input nodes of a first neural network layer to form a close-loop neural network.

14. The neural network array of claim 12, wherein output nodes of any first selected neural network layer are selectively connected in a feedback configuration to input nodes of any second selected neural network layer to form a close-loop neural network.

15. The neural network array of claim 1, wherein the direct in-array training includes forward propagation using input signals applied to the input nodes and back-propagation using target voltages applied to the output nodes or bit lines connected thereto.

16. The neural network array of claim 1, wherein the non-volatile memory cells comprise resistive memory cells including a resistive layer and a selector device, and the selected characteristic is a resistance value adjusted during training.

17. The neural network array of claim 1, wherein the array is configured to implement analog neural networks by applying analog input voltages to the input nodes and using multiple threshold voltage levels in the non-volatile memory cells to represent analog synaptic weights.

18. A neural network array comprising:

a plurality of vertical strings in a three-dimensional (3D) non-volatile memory array, each vertical string having a drain select gate transistor connected to a plurality of non-volatile memory cells that are connected in series along a vertical channel, and wherein each non-volatile memory cell functions as a synapse and represents a synaptic weight based on a threshold voltage (Vt) or resistance of the non-volatile memory cell;

a plurality of output nodes, each output node connected to receive output signals from a plurality of drain terminals of the drain select gates;

a plurality of input nodes, each input node connected to provide input signals to a plurality of gate terminals of the drain select gates; and a plurality of weight select signals connected to the plurality of memory cells in each string, respectively, and wherein each weight select signal provides a selected voltage to a selected non-volatile memory cell to cause the selected non-volatile memory cell to conduct current according to a selected characteristic of the selected non-volatile memory cell;

wherein a plurality of the neural network arrays share a single synapse array and are configured to simulate multiple neural network layers by sequentially selecting different sets of weight select signals and feeding back outputs as inputs.

19. A neural network array comprising:

a plurality of vertical strings in a three-dimensional (3D) non-volatile memory array, each vertical string having a drain select gate transistor connected to a plurality of non-volatile memory cells that are connected in series along a vertical channel, and wherein each non-volatile memory cell functions as a synapse and represents a synaptic weight based on a threshold voltage (Vt) or resistance of the non-volatile memory cell;

a plurality of output nodes, each output node connected to receive output signals from a plurality of drain terminals of the drain select gates;

a plurality of input nodes, each input node connected to provide input signals to a plurality of gate terminals of the drain select gates;

a plurality of weight select signals connected to the plurality of memory cells in each string, respectively, and wherein each weight select signal provides a selected voltage to a selected non-volatile memory cell to cause the selected non-volatile memory cell to conduct current according to a selected characteristic of the selected non-volatile memory cell; and source lines connected to the strings, wherein during back-propagation, target voltages are propagated from the output nodes through selected cells to the source lines to generate targets for previous layers.

* * * * *